United States Patent
Kim et al.

(10) Patent No.: US 8,174,477 B2
(45) Date of Patent: May 8, 2012

(54) GATE DRIVER AND REPAIRING METHOD THEREOF

(75) Inventors: Binn Kim, Seoul (KR); Kwon Shik Park, Seoul (KR); Soo Young Yoon, Goyang-si (KR); Min Doo Chun, Seoul (KR)

(73) Assignee: LG Display Co., Ltd., Seoul (KR)

( * ) Notice: Subject to any disclaimer, the term of this patent is extended or adjusted under 35 U.S.C. 154(b) by 798 days.

(21) Appl. No.: 11/717,188

(22) Filed: Mar. 13, 2007

(65) Prior Publication Data
US 2007/0216634 A1    Sep. 20, 2007

(30) Foreign Application Priority Data
Mar. 17, 2006 (KR) .................. 10-2006-0024794

(51) Int. Cl.
  G09G 3/36    (2006.01)
(52) U.S. Cl. .......................... 345/100; 377/64
(58) Field of Classification Search .................. 345/100; 377/64
See application file for complete search history.

(56) References Cited

U.S. PATENT DOCUMENTS

| 6,690,347 | B2 * | 2/2004 | Jeon et al. | 345/100 |
| 2004/0104882 | A1 * | 6/2004 | Kitani et al. | 345/100 |
| 2007/0085809 | A1 * | 4/2007 | Wei et al. | 345/100 |

FOREIGN PATENT DOCUMENTS

KR    2005-011022 A    11/2005

\* cited by examiner

*Primary Examiner* — Amr Awad
*Assistant Examiner* — Aaron Midkiff
(74) *Attorney, Agent, or Firm* — McKenna Long & Aldridge, LLP

(57) ABSTRACT

A gate driver and a repairing method are disclosed, wherein the gate driver is provided with one or more plurality of auxiliary stages that can substitute for a disabled stage, the gate driver including a shift register provided with a plurality of first output lines; at least three output repairing lines arranged across the first output lines; at least two clock transmission lines to transmit at least two clock pulses of different phases; at least one clock repairing line arranged across the clock transmission lines; and at least one auxiliary stage connected to the output repairing lines and to the at least one clock repairing line.

7 Claims, 10 Drawing Sheets

GATE DRIVER AND REPAIRING METHOD THEREOF

This application claims the benefit of Korean Patent Application No. 2006-024794 filed Mar. 17, 2006, which is hereby incorporated by reference for all purposes as if fully set forth herein.

BACKGROUND OF THE INVENTION

1. Field of the Invention

The present invention relates to a gate driver, and more particularly, to a gate driver that can repair defects or faults in shift register stages and a repairing method for same.

2. Discussion of the Related Art

A liquid crystal display (LCD) device displays images by controlling the light transmittance of a liquid crystal layer using an electric field. To display images, a typical LCD device includes an LCD panel and a driving circuit, wherein the LCD panel includes a plurality of pixel regions arranged in a matrix configuration, and the driving circuit drives the LCD panel.

A typical LCD panel includes a plurality of gate lines and data lines. Each of the gate lines is substantially perpendicular to each of the data lines, thereby defining a plurality of pixel regions at crossings of the gate and data lines. Pixel electrodes and a common electrode are provided in the LCD panel for applying an electric field to the pixel regions.

The pixel electrodes may be connected to the data lines through source and drain terminals of thin film transistors (TFTs), functioning as switching devices. The TFTs are turned-on in response to a scan pulse applied to gate terminals of the TFTs that are connected to the gate lines. When the TFT for a pixel is turned on, the pixel electrode for the pixel is charged with a data signal on a data line.

The driving circuit includes a gate driver that drives the gate lines; a data driver that drives the data lines; a timing controller that supplies control signals to control the gate and data drivers; and a power supply that supplies various driving voltages to the LCD device.

The timing controller controls the driving timing of the gate and data drivers, and supplies a pixel data signal to the data driver. The power supply generates driving voltages such as a common voltage VCOM, a gate high-voltage signal VGH, and a gate low-voltage signal VGL by raising or reducing a voltage of input power supplied to the LCD device. The gate driver sequentially supplies scan pulses to the gate lines to sequentially drive liquid crystal cells of the LCD panel line by line. The data driver supplies a pixel voltage signal to each of the data lines during the period when the scan pulse is supplied to any one of the gate lines. Accordingly, the LCD device displays images by controlling the light transmittance using the electric field generated between the pixel electrodes and the common electrode according to the pixel voltage signal supplied to each liquid crystal cell.

The gate driver includes a gate driving circuit which sequentially outputs the scan pulses. The gate driving circuit typically includes a shift register.

Hereinafter, a gate driver of the related art will be explained with reference to FIG. 1 of the accompanying drawings. FIG. 1 is a block diagram illustrating a related art shift register.

The related art shift register is provided with 'n' stages ST101 to ST10n and a dummy stage ST10n+1, which are connected to one another in sequence. Excluding the dummy stage ST10n+1, the first to (n)th stages ST101 to ST10n respectively output scan pulses to gate lines of a display area, in sequence.

Each of the stages after the first stage ST101 is enabled in response to the scan pulse output from the preceding stage, and each stage excluding the dummy stage is also disabled in response to the scan pulse output from the next stage. To accomplish the enabling and disabling functions, each of the stages is provided with three output lines 141a, 141b and 141c. More particularly, for each of the stages, a corresponding first output line 141a electrically connects the corresponding stage to the corresponding gate line, a second output line 141b electrically connects the corresponding stage to the next stage, and a corresponding third output line 141c electrically connects the corresponding stage to the preceding stage.

When any one of the stages ST101 to ST10n+1 is disabled due to defects or faults, none of the stages sequentially following the disabled stage can generate and supply an output to the corresponding gate line. For example, as shown in FIG. 1, if defects disable the third stage ST103, the third stage ST103 does not output a scan pulse. The fourth stage ST104 positioned following the third stage ST103 would normally be enabled in response to a scan pulse output from the third stage ST103. However, because the third stage ST103 is defective, the fourth stage ST104 is not enabled and does not generate an output pulse.

Similarly, the fifth stage ST105 positioned following the fourth stage ST104 that would be enabled in response to the scan pulse output from the fourth stage ST104 is not enabled because the scan pulse is not output by the fourth stage, and accordingly the fifth stage ST105 is disabled. Similarly, the scan pulses are not generated or output from the sixth to (n)th stages ST106 to ST10n.

Accordingly, the fault in the third stage prevents driving the third to (n)th gate lines connected to the third to (n)th stages ST103 to ST10n of the gate driver of the related art. As a result, images are not displayed by the liquid crystal cells connected to the third to (n)th gate lines.

SUMMARY OF THE INVENTION

Accordingly, the present invention is directed to a gate driver and a repairing method thereof that substantially obviates one or more of the problems due to limitations and disadvantages of the related art.

An advantage of the present invention is to provide a gate driver provided with a plurality of auxiliary stages which substitute for a disabled stage, so as to repair the disabled stage, and a repairing method thereof.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the invention, as embodied and broadly described herein, there is provided a gate driver including: a shift register provided with a plurality of first output lines; at least three output repairing lines arranged across the first output lines; at least two clock transmission lines to transmit at least two clock pulses of different phases; at least one clock repairing line arranged across the clock transmission lines; and at least one auxiliary stage connected to the output repairing lines and to the at least one clock repairing line.

In another aspect of the present invention, a gate driver includes: a shift register provided with a plurality of first output lines; at least two output repairing lines arranged across the plurality of first output lines; at least two clock transmission lines to transmit at least two clock pulses provided with a phase difference; at least two clock repairing lines arranged across the clock transmission lines; and at least one auxiliary stage connected to the output repairing lines and clock repairing lines, wherein the shift register includes a plurality of stages in sequence each stage connected to one end of a corresponding first output line of the plurality of first output lines.

In another aspect of the present invention, a repairing method of a gate driver provided with a shift register including: a plurality of stages in a sequence each provided with output lines; first, second and third output repairing lines arranged across the output lines; at least two clock transmission lines to transmit at least two clock pulses provided with a phase difference therebetween; a clock repairing line arranged across the clock transmission lines; and an auxiliary stage connected to the first output repairing line, the second output repairing line, the third output repairing line and the clock repairing line, includes: connecting the output line of the stage, prior in the sequence to a predetermined stage among the plurality of stages provided in the shift register, to the first output repairing line; connecting the output line of the predetermined stage to the second output repairing line; connecting the output line of the stage, subsequent in the sequence to the predetermined stage, to the third output repairing line; and connecting the clock repairing line to one of the clock transmission lines that transmits the clock pulse to the predetermined stage.

In another aspect of the present invention, a repairing method of a gate driver provided with a shift register including: a plurality of stages in a sequence each provided with a corresponding output line; first, second and third output repairing lines arranged across the output lines; at least two clock transmission lines to transmit at least two clock pulses provided with a phase difference therebetween; first and second clock repairing lines arranged across the clock transmission lines; a first auxiliary stage connected to one end of the first output repairing line, one end of the second output repairing line, one end of the third output repairing line, and the first clock repairing line; and a second auxiliary stage connected to the other end of the first output repairing line, the other end of the second output repairing line, the other end of the third output repairing line, and the second clock repairing line includes: connecting the first output repairing line to the output line of a stage prior in the sequence to a first predetermined stage among the plurality of stages provided in the shift register; connecting the second output repairing line to the output line of the first predetermined stage; connecting the third output repairing line to the output line of a stage subsequent in sequence to the first predetermined stage; connecting the first output repairing line to the output line of a stage prior in sequence to a second predetermined stage among the plurality of stages provided in the shift register; connecting the second output repairing line to the output line of the second predetermined stage; connecting the third output repairing line to the output line of a stage positioned subsequent in sequence to the second predetermined stage; connecting the first clock repairing line to one of the clock transmission line that transmits the clock pulse to the first predetermined stage; connecting the second clock repairing line to one of the clock transmission line that transmits the clock pulse to the second predetermined stage; and disconnecting predetermined portions of the respective first, second and third output repairing lines.

In another aspect of the present invention, a repairing method of a gate driver provided with a shift register including: a plurality of stages in a sequence each provided with a corresponding output line; first and second output repairing lines arranged across the output lines; at least two clock transmission lines to transmit at least two clock pulses provided with a phase difference therebetween; first and second clock repairing lines arranged across the clock transmission lines; and an auxiliary stage connected to the first output repairing line, the second output repairing line, the first clock repairing line, and the second clock repairing line includes: connecting the first output repairing line to the output line of the stage positioned prior to a predetermined stage among the plurality of stages provided in the shift register; connecting the second output repairing line to the output line of the predetermined stage; connecting the first clock repairing line to one of the clock transmission line that transmits the clock pulse to the predetermined stage; and connecting the second clock repairing line to one of the clock transmission line that transmits the clock pulse to the stage positioned following the predetermined stage.

In another aspect of the present invention, a repairing method of a gate driver provided with a shift register including: a plurality of stages in a sequence each provided with a corresponding output line; first and second output repairing lines arranged across the output lines; at least two clock transmission lines to transmit at least two clock pulses provided with a phase difference; first, second, third and fourth clock repairing lines arranged across the clock transmission lines; a first auxiliary stage connected to one end of the first output repairing line, one end of the second output repairing line, one end of the third output repairing line, the first clock repairing line, and the second clock repairing line; and a second auxiliary stage connected to the other end of the first output repairing line, the other end of the second output repairing line, the other end of the third output repairing line, the third clock repairing line, and the fourth clock repairing line includes: connecting the first output repairing line to the output line of the stage prior in the sequence to a first predetermined stage among the plurality of stages provided in the shift register; connecting the second output repairing line to the output line of the first predetermined stage; connecting the first output repairing line to the output line of the stage positioned prior in the sequence to a second predetermined stage among the plurality of stages provided in the shift register; connecting the second output repairing line to the output line of the second predetermined stage; connecting the first clock repairing line to one of the clock transmission line that transmits the clock pulse to the first predetermined stage; connecting the second clock repairing line to one of the clock transmission line that transmits the clock pulse to the stage positioned subsequent in the sequence to the first predetermined stage; connecting the third clock repairing line to one of the clock transmission line that transmits the clock pulse to the second predetermined stage; connecting the fourth clock repairing line to one of the clock transmission line that transmits the clock pulse to the stage positioned subsequent in the sequence to the second predetermined stage; and disconnecting a predetermined portion of the first output repairing line and a predetermined portion of the second output repairing line.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

In the drawings.

DETAILED DESCRIPTION OF THE ILLUSTRATED EMBODIMENTS

Reference will now be made in detail to embodiment of the present invention, examples of which is illustrated in the accompanying drawings. Wherever possible, the same reference numbers will be used throughout the drawings to refer to the same or like parts.

Hereinafter, a gate driver according to embodiments of the present invention will be explained with reference to the accompanying drawings.

Figure 1:
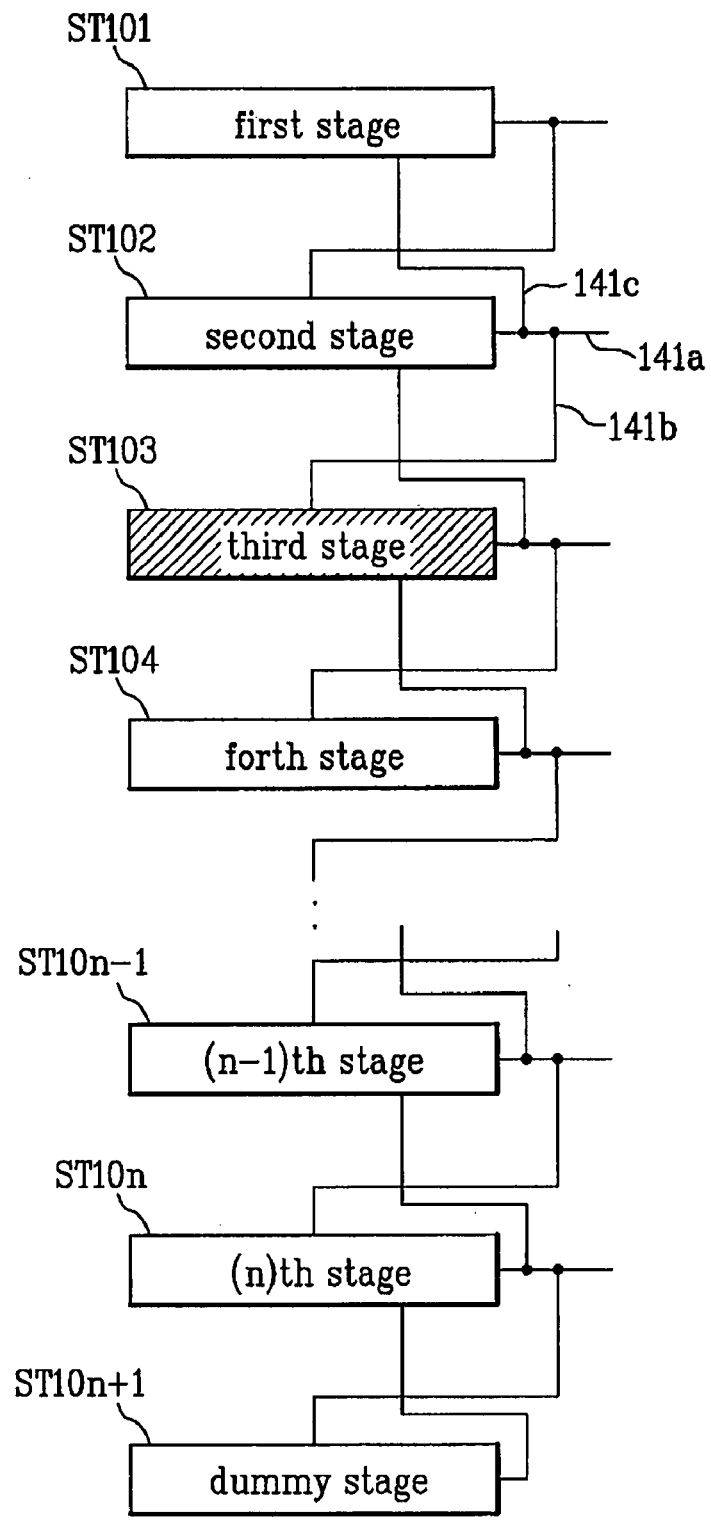
FIG. 1 is a block diagram illustrating a related art shift register.
Figure 2:
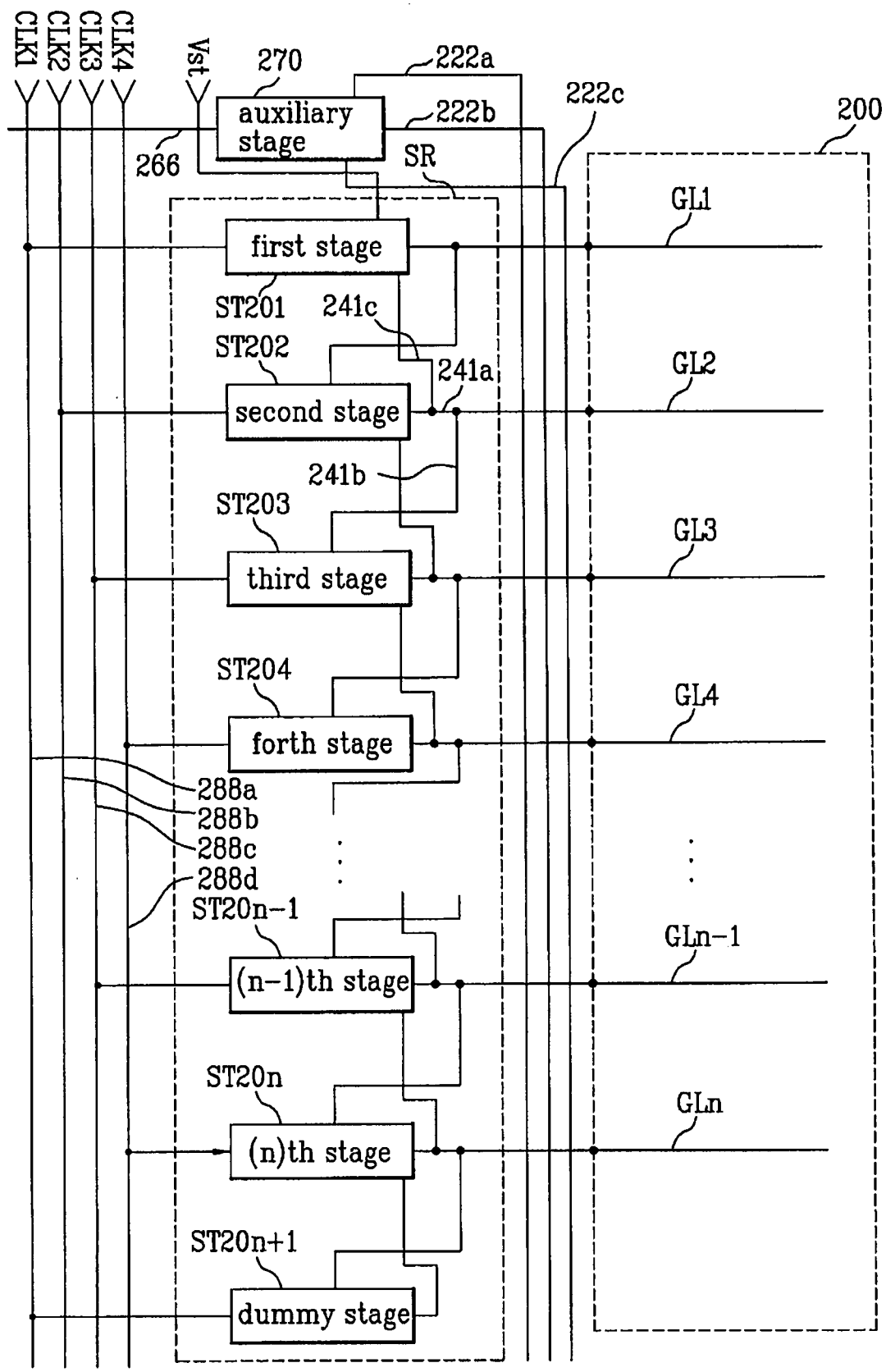
FIG. 2 is a block diagram schematically illustrating a gate driver according to a first embodiment of the present invention.

FIG. 2 is a block diagram illustrating a gate driver according to a first embodiment of the present invention. As shown in FIG. 2, the gate driver according to the first embodiment of the present invention includes a shift register SR including a plurality of first output lines 241a; first, second and third output repairing lines 222a, 222b and 222c arranged to cross the first output lines 241a; first to fourth clock transmission lines 288a to 288d to transmit first to fourth clock pulses CLK1 to CLK4 provided with a phase difference; a clock repairing line 266 arranged to cross the first to fourth clock transmission lines 288a to 288d; and an auxiliary stage 270 connected to the first to third output repairing lines 222a, 222b and 222c and the clock repairing line 266.

The shift register SR of FIG. 2 includes first to (n)th stages ST201 to ST20n, and a dummy stage ST20n+1. Each of the first to (n)th stages and the dummy stage outputs a scan pulse to the display area 200 of an LCD panel in sequence. Excluding the dummy stage ST20n+1, each of the first to (n)th stages ST201 to ST20n supplies a scan pulse to a corresponding gate line of the display area 200. As a result, the gate lines GL1 to GLn are driven in sequence.

Each of the stages ST201 to ST20n+1 is enabled in response to the scan pulse output from the preceding stage in the sequence, and is disabled in response to the scan pulse output from the next stage in the sequence of stages. As any one of at least two clock pulses having different phases is applied to the enabled stage, the enabled stage supplies the clock pulse to the corresponding gate line. In other words the clock pulse is output as a scan pulse. On the other hand, each disabled stage supplies a signal having an off-voltage to the corresponding gate line so that the corresponding gate line is inactivated.

For example, the second stage ST202 is enabled in response to the first scan pulse output from the first stage ST201, and the second stage ST202 is disabled in response to the third scan pulse output from the third stage ST203. Accordingly, as the second clock pulse CLK2 among the first to fourth clock pulses CLK1 to CLK4 each differing in phase is applied to the second stage ST202, the second stage ST202 is enabled to supply the second clock pulse CLK2 to the second gate line GL2. The second clock pulse CLK2 supplied by the second stage ST202 functions as the second scan pulse.

To accomplish the above described operation, each of the stages ST202 to ST20n, and exclusive of the first stage ST201 and the dummy stage ST20n+1, is provided with first to third output lines 241a, 241b, and 241c that conduct the scan pulses, a first input terminal to which the clock pulses are applied from the clock transmission lines 288a to 288d; and second and third input terminals to which the scan pulses are applied from the preceding and following stages in sequence.

For each of the stages ST201 to ST20n, the first output line 241a electrically connects its own stage to the corresponding gate line; the second output line 241b electrically connects the first output line 241a of the corresponding stage to the next stage; and the third output line 241c electrically connects the first output line 241a of the corresponding stage to the preceding stage.

One end of the first output line 241a provided in each of the stages ST201 to ST20n is connected to the corresponding stage ST201 to ST20n, and the other end thereof is connected to the corresponding gate line GL1 to GLn. In addition, one end of the second output line 241b provided in each of the stages ST201 to ST20n is connected to the first output line 241a of the corresponding stage, and the other end thereof is connected to the second input terminal of the next stage in sequence. Further, one end of the third output line 241c provided in each of the stages ST201 to ST20n is connected to the first output line 241a of the corresponding stage, and the other end thereof is connected to the third input terminal of the preceding stage in the sequence of stages. The first input terminal of each of the stages ST201 to ST20n is connected to the corresponding clock transmission line.

For example, the first output line 241a of the second stage ST202 electrically connects the second stage ST202 to the first gate line GL2. In addition, the second output line 241b of the second stage ST202 electrically connects to the first output line 241a of the second stage ST202 to the third stage ST203. The third output line 241c of the second stage ST202 electrically connects the first output line 241a of the second stage ST202 to the first stage ST201.

As there is no stage sequentially prior to the first stage ST201, the first stage ST201 includes the first output line 241a, the second output line 241b, the first input terminal, and the second input terminal.

As there is no stage sequentially following the dummy stage ST20n+1, the dummy stage ST20n+1 includes the third output line 241c and the second input terminal. Further, the dummy stage ST20n+1 has no output connection to a corresponding gate line.

The first to third output repairing lines 222a, 222b, and 222c may be formed on a layer above the first output lines 241a, and are arranged to cross the first output lines 241a. An insulation layer may formed between the first output lines 241a and each of the output repairing lines 222a, 222b, and 222c, to electrically isolate each of the output repairing lines 222a, 222b, and 222c from the first output lines 241a.

The auxiliary stage 270 includes three input terminals and one output terminal. In the illustrated case, the first input terminal of the auxiliary stage 270 is connected to the clock repairing line 266; the second input terminal of the auxiliary stage 270 is connected to the first output repairing line 222a; the third input terminal of the auxiliary stage 270 is connected to the third output repairing line 222c; and the output terminal of the auxiliary stage 270 is connected to the second output repairing line 222b.

The clock repairing line 266 is formed above the clock transmission lines 288a to 288d, and is arranged across the clock transmission lines 288a to 288d. An insulation layer may be formed between the clock repairing line 266 and the clock transmission lines 288a to 288d to electrically isolate the clock repairing line 266 from the clock transmission lines 288a to 288d.

The auxiliary stage 270 operates in a similar manner that of the stages ST201 to ST20n+1. That is, the auxiliary stage 270 is enabled in response to the signal input through its second input terminal. In the enabled state, the auxiliary stage 270 outputs the signal (clock pulse) applied to its first input terminal through its output terminal to serve as a repairing scan pulse.

A method of repairing the gate driver according to the first embodiment of the present invention having a stage disabled due to defects or faults will be explained in detail with reference to FIG. 3.

Figure 3:
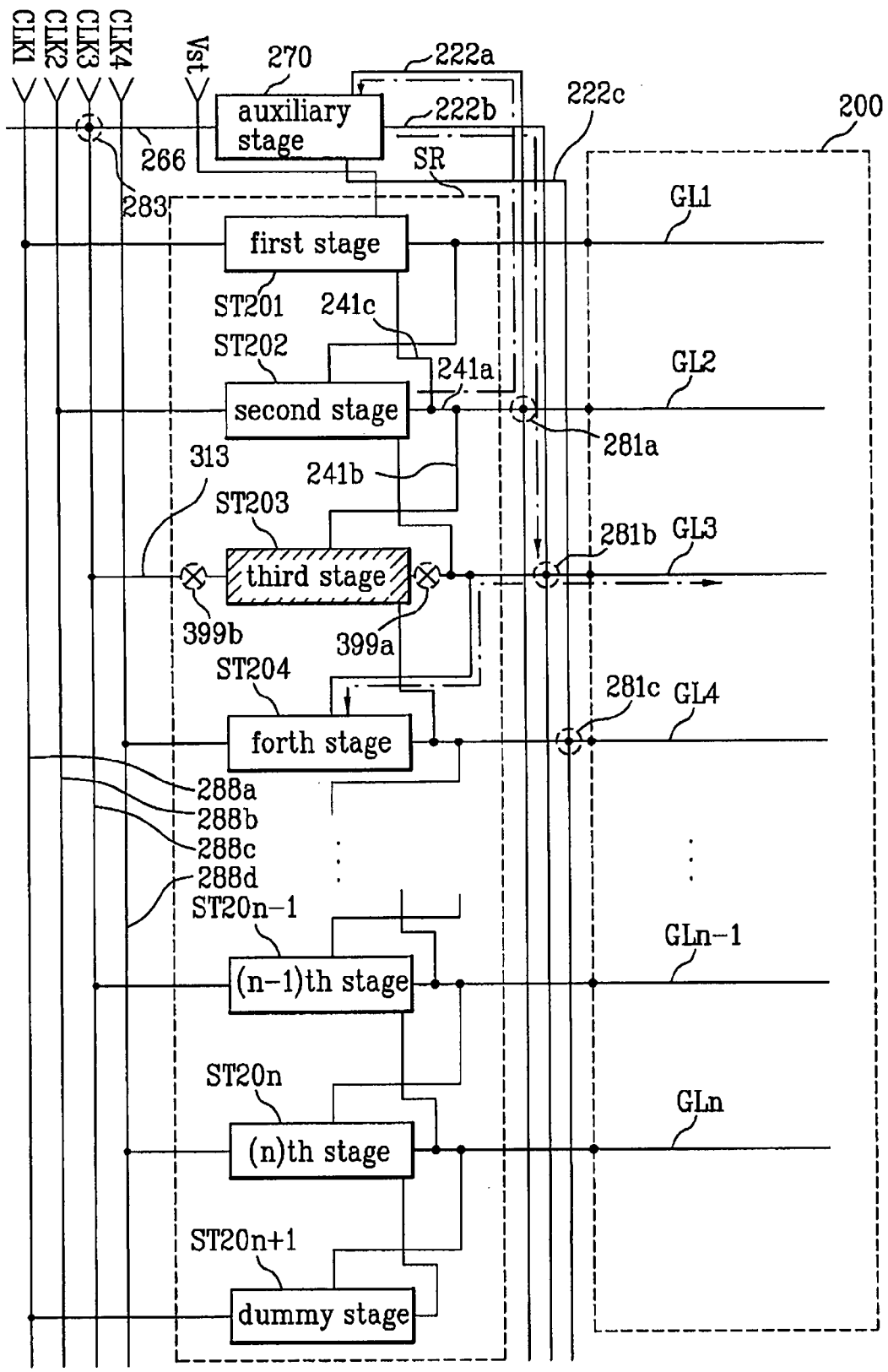
FIG. 3 is a block diagram schematically illustrating a repairing method for the gate driver of FIG. 2 when a third stage of the gate driver is disabled.

FIG. 3 is a block diagram illustrating a repairing method of the gate driver according to FIG. 2 using the example of a faulty third stage. As shown in FIG. 3, when the third stage ST203 is disabled by a fault or defect, the third stage ST203 generates no output.

With the first and second stages ST201 and ST202 normally driven, the first and second gate lines GL1 and GL2 are normally driven. However because the third stage ST203 is faulty, the third stage, and the fourth to dummy stages ST204 to ST20n+1 following the third stage ST203 do not output scan pulses. Accordingly, the scan pulses are not supplied to the third to (n)th gate lines GL3 to GLn respectively connected to the third to (n)th stages ST203 to ST20n.

To repair the above-mentioned gate driver having the faulty third stage ST203, the third stage ST203 is electrically isolated from the first output line 241a (that is the first output line 241a connected to the third stage ST203). As shown in FIG. 3, a predetermined portion 399a of the first output line 241a may be removed using a laser, thereby electrically separating and isolating the third stage ST203 from the first output line 241a. The removed predetermined portion 399a of the first output line 241a is between the output terminal of the third stage ST203 and a crossing point (that is, the crossing point between the first output line 241a of the third stage ST203 and the third output line 241c).

The third stage ST203 is also electrically isolated from the third clock transmission line 288c. As shown in FIG. 3, a laser may be applied to a predetermined portion 399b of the transmission line 313 that electrically connects the third clock transmission line 288c to the third stage ST203 to electrically isolate the third clock transmission line 288c from the third stage ST203. As a result, the third stage ST203 is electrically isolated from the third gate line GL3, so as to prevent a distorted scan pulse output from the third stage ST203 from being supplied to the third gate line GL3.

The second output repairing line 222b is electrically connected to one of the first output lines 241a. In the case of a gate driver having a defective third stage ST203, the first output line 241a corresponds to the first output line 241 of the disabled third stage ST203. The electrical connection to the repairing line 222b may be made by welding a crossing point 281b between the second output repairing line 222b and the second output line 241b using a laser.

The first output repairing line 222a is electrically connected to another of the first output lines 241a. In the illustrated example of the gate driver having a defective third stage ST203, the first output line 241a corresponding to the first output line 241a of the second stage ST202 sequentially prior to the disabled stage is connected to the first output repairing line 222a. This second electric connection may be made by welding a crossing point 281a between the first output repairing line 222a and the first output line 241a using a laser.

The third output repairing line 222c is electrically connected to still another of the first output lines 241a. In the example of the gate driver having a defective third stage ST203, the first output line 241a corresponding to the first output line 241a connected to the fourth stage ST204 sequentially following the disabled third stage ST203 is connected to third output repairing line 222c. This electric connection may be made by welding a crossing point 281c between the third output repairing line 222c and the first output line 241a using laser.

The clock repairing line 266 is electrically connected to any one of the clock transmission lines 288a to 288d. In particular, the clock transmission line transmitting the clock pulse which is identical or substantially identical in timing to the clock pulse supplied to the disabled stage, in the illustrated case, the third stage ST203 is used. That is, the clock transmission line corresponding to the third clock transmission line 288c that transmits the third clock pulse CLK3 is electrically connected to the clock repairing line 266. This electric connection may be made by welding a crossing point 283 between the clock repairing line 266 and the third clock transmission line 241a using a laser.

After the above described repair operations are completed, the first input terminal of the auxiliary stage 270 is electrically connected to the third clock transmission line 288c using the clock repairing line 266. Additionally, the second input terminal of the auxiliary stage 270 is electrically connected to the first output line 241a (the first output line 241a connected to the second stage ST202) by the first output repairing line 222a. The output terminal of the auxiliary stage 270 is connected to the first output line 241a (the first output line 241a connected to the third stage ST203) by the second output repairing line 222b. In addition, the third input terminal of the auxiliary stage 270 is connected to the first output line 241a (the first output line 241a connected to the fourth stage ST204) by the third output repairing line 222c.

When operating the repaired gate driver according to the first embodiment of the present invention, the first stage ST201 is enabled in response to the start pulse Vst. While in the enabled state, the first stage ST201 outputs the first clock pulse CLK1 that is supplied from the first clock transmission line 288a as the first scan pulse. The first scan pulse is then supplied to the first gate line GL1 through the first output line 241a of the first stage ST201, and is also supplied to the second stage ST202 through the first and second output lines 241a and 241b of the first stage ST201.

The second stage ST202 is enabled in response to the first scan pulse output from the first stage ST201. While in the enabled state, the second stage ST202 outputs the second clock pulse CLK2 that is supplied from the second clock transmission line 288b as the second scan pulse. The second scan pulse is then supplied to the second gate line GL2 through the first output line 241a of the second stage ST202, to the third stage ST203 through the first and second output lines 241a and 241b of the second stage ST202, and to the first stage ST201 through the first and third output lines 241a and 241c of the second stage ST202. However, a fault in the third stage ST203 prevents the third stage ST203 from being enabled. Thus, even though the second stage ST202 outputs the second scan pulse to the third stage ST203, the third stage ST203 is unable to output the third scan pulse.

The second scan pulse supplied to the first output line 241a of the second stage ST202 is supplied to the auxiliary stage 270 through the crossing point 281a and the first output repairing line 222a. Accordingly, the auxiliary stage 270 is enabled in response to the second scan pulse. In the enabled state, the auxiliary stage 270 outputs the third clock pulse CLK3 supplied from the third clock transmission line 288c as the repairing scan pulse. This repairing scan pulse is identical or substantially identical in timing to the third scan pulse that would be output from a properly functioning third stage ST203.

The repairing scan pulse output from the auxiliary stage 270 is supplied to the second output repairing line 222b through the output terminal. The repairing scan pulse supplied to the second output repairing line 222b is applied to the fourth stage ST204 through the crossing point 281b, the first output line 241a (the first output line 241a connected to the third stage ST203), and the second output line 241b (the second output line 241b connected to the third stage ST203). Accordingly, the fourth stage ST204 is enabled by the repairing scan pulse. As a result, the fourth to dummy stages ST204 to ST20n+1 output the scan pulses in sequence. The auxiliary stage 270 outputs the scan pulse in place of the faulty third stage ST203.

In addition, the scan pulse output from the fourth stage ST204 is supplied to the auxiliary stage 270 through the first output line 241a (the first output line 241a connected to the fourth stage ST204), the crossing point 281c, and the third output repairing line 222c so that the auxiliary stage 270 is disabled. Accordingly, the auxiliary stage 270 outputs the scan pulse for each frame. The third input terminal of the auxiliary stage 270 may alternatively be connected to a clock repairing line instead of the third output repairing line 222c.

Hereinafter, a gate driver according to a second embodiment of the present invention will be explained as follows.

Figure 4:
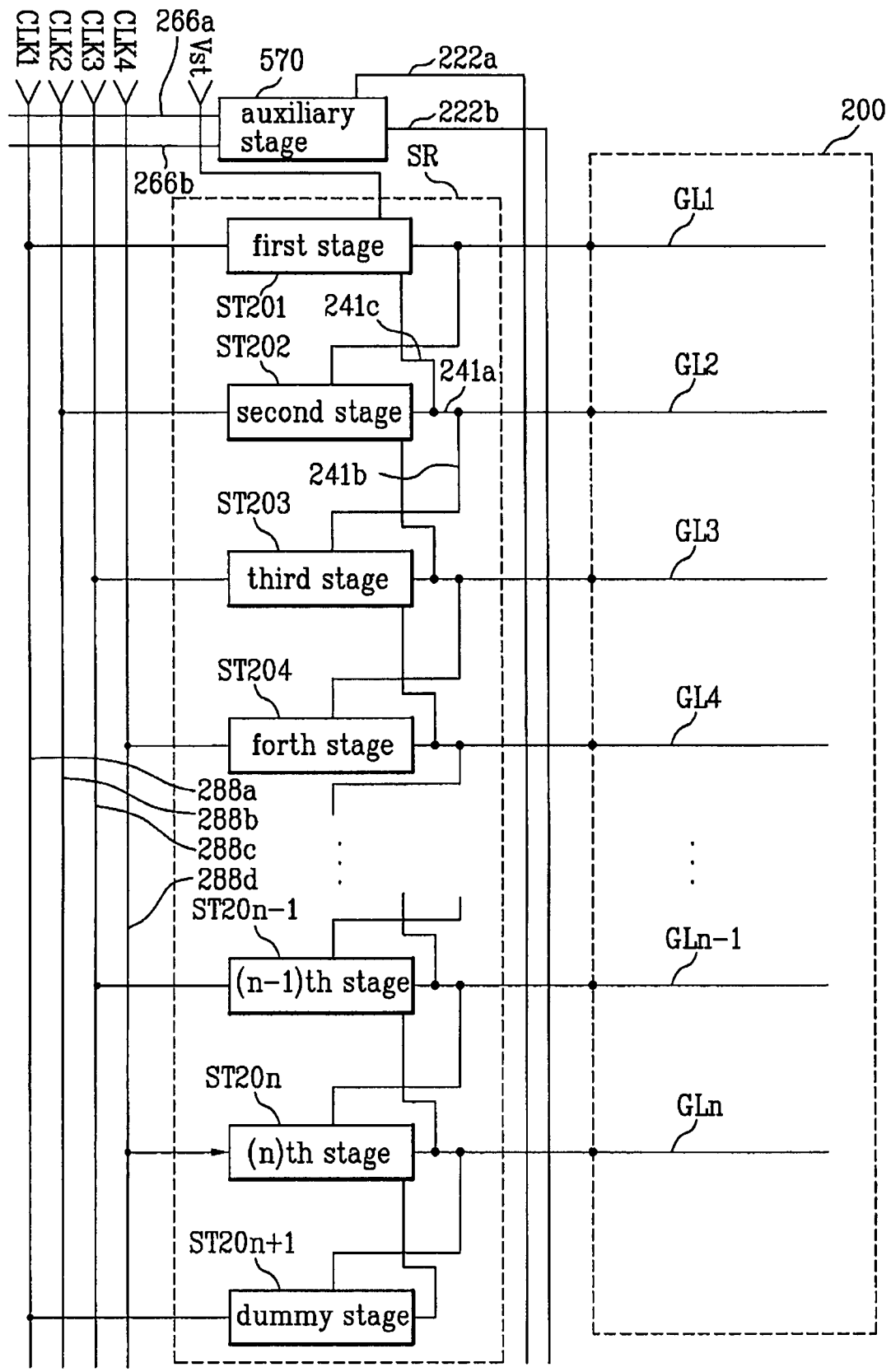
FIG. 4 is a is a block diagram schematically illustrating a gate driver according to a second embodiment of the present invention.

FIG. 4 is a block diagram illustrating a gate driver according to the second embodiment of the present invention.

The gate driver according to the second embodiment of the present invention differs from the gate driver according to the first embodiment primarily by using a second clock repairing line 266b instead of using third output repairing line as may be appreciated from FIG. 4. In the gate driver according to the second embodiment of the present invention, an auxiliary stage 570 is connected to a first clock repairing line 266a through a first input terminal and is connected to a second clock repairing line 266b through a third input terminal. As shown in FIG. 4, each of the first and second clock repairing lines 266a and 266b is arranged to cross the first to fourth clock transmission lines 288a to 288d.

A method of repairing a gate driver according to the second embodiment of the present invention having any one stage disabled due to defects or faults will be explained in detail with reference to FIG. 5.

Figure 5:
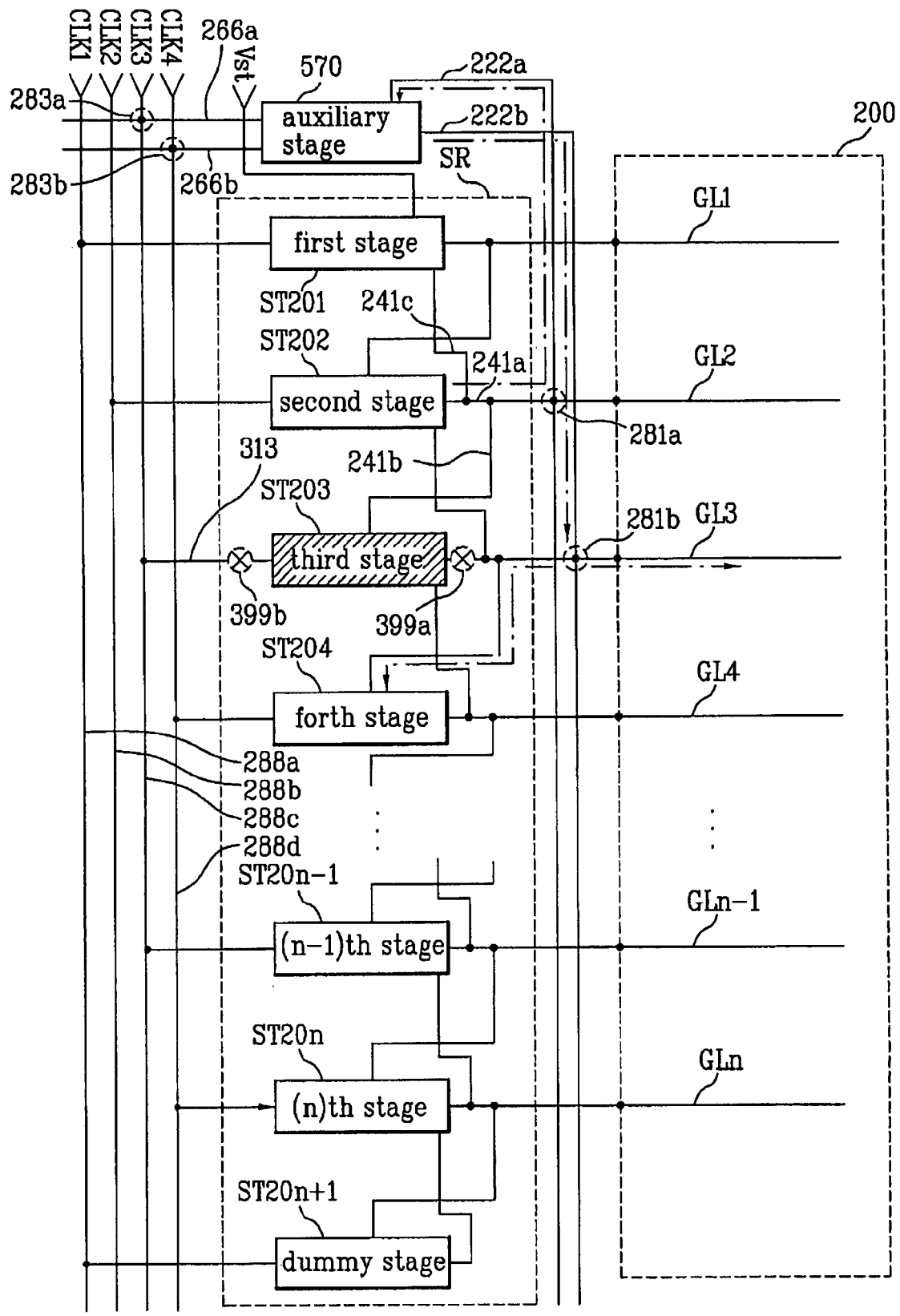
FIG. 5 is block diagram schematically illustrating a repairing method of the gate driver of FIG. 4 when a third stage of the gate driver is disabled.

FIG. 5 is a block diagram illustrating a repairing method of the gate driver when the third stage of FIG. 4 is disabled. As shown in FIG. 5, when the third stage ST203 is disabled, the third stage ST203 generates no output. As may be appreciated by referring to FIG. 5, the first and second stages ST201 and ST202 operate normally to drive the first and second gate lines GL1 and GL2, while the third stage ST203 is disabled due to a fault. Accordingly, the third stage ST303 and the fourth to dummy stages ST204 to ST20n+1 following the third stage ST203 cannot output their corresponding scan pulses. Thus, as shown in FIG. 5, the scan pulses are not supplied to the third to (n)th gate lines GL3 to GLn respectively connected to the third to (n)th stages ST203 to ST20n.

To repair the above-described gate driver having a faulty third stage ST203, the third stage ST203 is electrically isolated from the first output line 241a (the first output line 241a connected to the third stage ST203). Referring to FIG. 5, a predetermined portion 399a of the first output line 241a may be removed by applying laser to electrically isolate the third stage ST203 from the first output line 241a. The disconnected portion 399a of the first output line 241a may be positioned between an output terminal of the third stage ST203 and a crossing point (that is the crossing point between the first output line 241a of the third stage ST203 and the third output line 241c).

The third stage ST203 is electrically isolated from the third clock transmission line 288c. As shown in FIG. 5, a laser may be applied to a predetermined portion 399b of the transmission line 313 that electrically connects the third clock transmission line 288c with the third stage ST203 to electrically isolate the third clock transmission line 288c from the third stage ST203. By electrically isolating the third stage ST203 from the third gate line GL3, a distorted scan pulse output from the faulty third stage ST203 is prevented from reaching the third gate line GL3.

The second output repairing line 222b is electrically connected to a selected one of the first output lines 241a. In the illustrated case involving a faulty third stage ST203, the selected first output line 241a corresponds to the first output line 241a of the third stage ST203 having a defect or fault. This electric connection may be made by welding a crossing point 281b between the second output repairing line 222b and the second output line 241b using a laser.

The first output repairing line 222a is electrically connected to a second selected one of the first output lines 241a. In the illustrated case involving a faulty third stage ST203, the second selected first output line 241a corresponds to the first output line 241a of the second stage ST202 that is positioned sequentially prior to the disabled third stage ST203. This electric connection may be made by welding a crossing point 281a between the first output repairing line 222a and the first output line 241a using a laser.

The first clock repairing line 266a is electrically connected to one of the clock transmission lines 288a to 288d. The first chosen clock transmission line is the one that transmits the clock pulse that is identical or substantially identical in timing to the clock pulse supplied to the faulty stage. In the illustrated case of a third stage ST203 having a fault or defect, the first chosen clock transmission line corresponds to the third clock transmission line 288c that transmits the third clock pulse CLK3. The third clock transmission line 288c is electrically connected to the first clock repairing line 266a. This electric connection may be made by welding a crossing point 283a between the first clock repairing line 266a and the third clock transmission line 288c using a laser.

The second clock repairing line 266b is electrically connected to another among the clock transmission lines 288a to 288d. The second selected clock transmission line is the clock transmission line that transmits the clock pulse that is identical or substantially identical in timing to the clock pulse supplied to the stage sequentially following the stage having the fault. In the illustrated case of a faulty third stage ST203, the second selected clock transmission line is the clock transmission line that corresponds to the fourth clock transmission line 288d that transmits the fourth clock pulse CLK4. The fourth clock transmission line 288d is electrically connected to the second clock repairing line 266b. This electric connection may be made by welding a crossing point 283b between the second clock repairing line 266b and the fourth clock transmission line 288d using a laser.

As a result of making the above described connections, the first input terminal of the auxiliary stage 570 is electrically connected to the third clock transmission line 288c by the first clock repairing line 266a. The third input terminal of the auxiliary stage 570 is electrically connected to the fourth clock transmission line 288d by the second clock repairing line 266b. In addition, the second input terminal of the auxiliary stage 570 is electrically connected to the first output line 241a (the first output line 241a connected to the second stage ST202) by the first output repairing line 222a. The output terminal of the auxiliary stage 570 is electrically connected to the first output line 241a (the first output line 241a connected to the third stage ST203) by the second output repairing line 222b.

When operating the repaired gate driver according to the second embodiment of the present invention, the first stage ST201 is initially enabled in response to the start pulse Vst. In this enabled state, the first stage ST201 outputs a first clock pulse CLK1 that is supplied from the first clock transmission line 288a, as the first scan pulse. The first scan pulse is supplied to the first gate line GL1 through the first output line 241a of the first stage ST201 and is also supplied to the second stage ST202 through the first and second output lines 241a and 241b of the first stage ST201.

The second stage ST202 is enabled in response to the first scan pulse output from the first stage ST201. In this enabled state, the second stage ST202 outputs the second clock pulse CLK2 that is supplied from the second clock transmission line 288b, as the second scan pulse. The second scan pulse is supplied to the second gate line GL2 through the first output line 241a of the second stage ST202, is supplied to the third stage ST203 through the first and second output lines 241a and 241b of the second stage ST202, and is supplied to the first stage ST201 through the first and third output lines 241a and 241c of the second stage ST202. Because the third stage ST203 is disabled by a fault or defect, even though the second stage ST202 outputs the second scan pulse to the third stage ST203, the third stage ST203 does not output the third scan pulse.

The second scan pulse supplied to the first output line 241a of the second stage ST202 is supplied to the auxiliary stage 570 through the crossing point 281a and the first output repairing line 222a. The auxiliary stage 570 is enabled in response to the second scan pulse. In this enabled state, the auxiliary stage 570 outputs the third clock pulse CLK3 supplied from the third clock transmission line 288c as the repairing scan pulse. This repairing scan pulse is identical or substantially identical in timing to the third scan pulse generated by a normally operating third stage ST203.

The repairing scan pulse output from the auxiliary stage 570 is supplied to the second output repairing line 222b through the output terminal. In addition, the repairing scan pulse supplied to the second output repairing line 222b is supplied to the fourth stage ST204 through the crossing point 281b, the first output line 241a (the first output line 241a connected to the third stage ST203), and the second output line 241b (the second output line 241b connected to the third stage ST203). Accordingly, the fourth stage ST204 is enabled. As a result, the fourth to dummy stages ST204 to ST20n+1 output the scan pulses in sequence. In summary, the auxiliary stage 570 outputs the required scan pulse in place of the faulty stage.

The fourth scan pulse CLK4 transmitted through the fourth clock transmission line 288d is supplied to the auxiliary stage 570 through the crossing point 283b and the second clock repairing line 266b. The auxiliary stage 570 is disabled in response to the fourth clock pulse CLK4. Accordingly, the auxiliary stage 570 outputs one scan pulse for each frame.

In an alternate embodiment of the present invention, the auxiliary stages may be electrically connected to each clock repairing line, and may be electrically connected to the three output repairing lines in common. This structure will be explained as follows.

Figure 6:
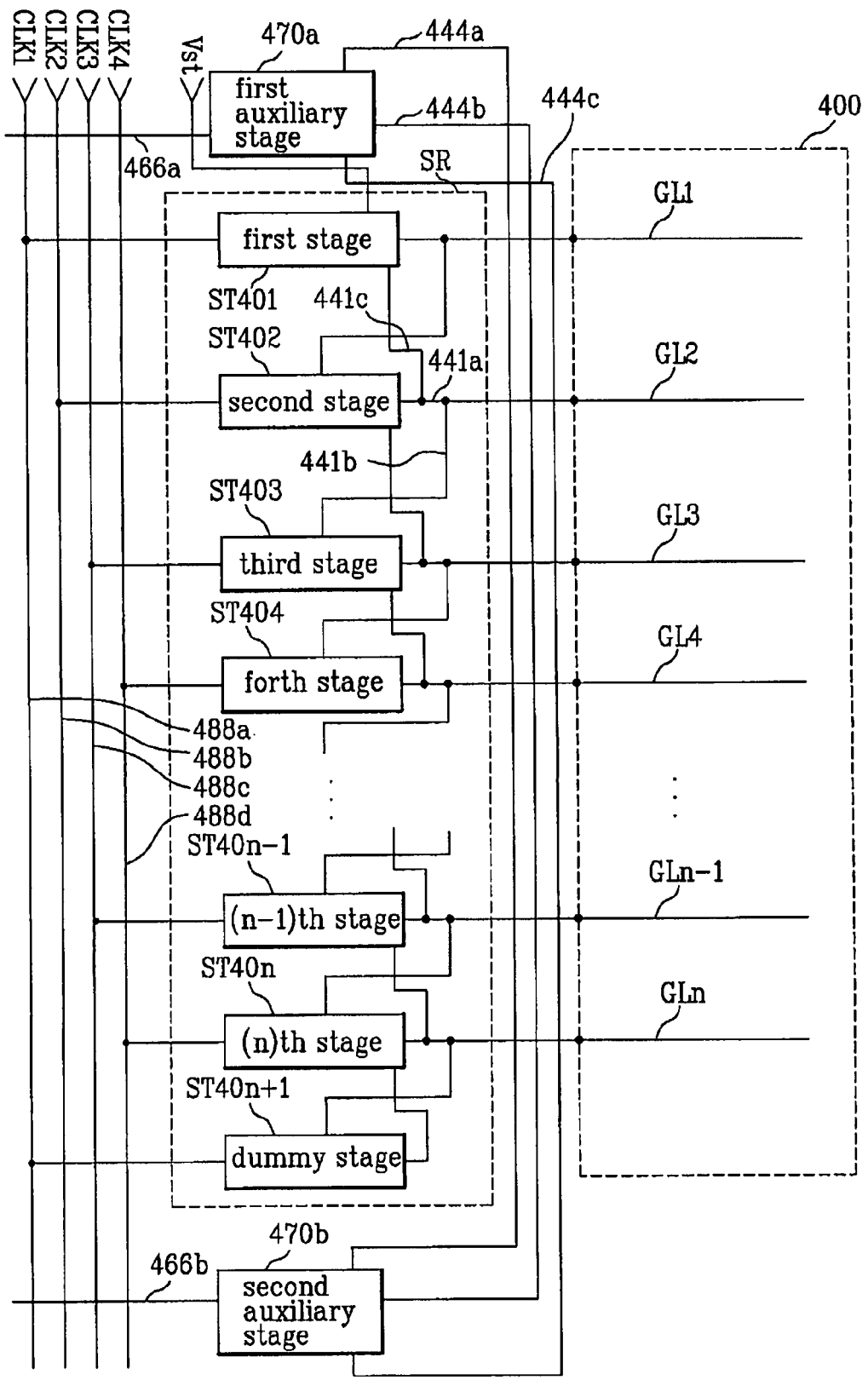
FIG. 6 is a block diagram schematically illustrating a gate driver according to a third embodiment of the present invention.

FIG. 6 is a block diagram illustrating a gate driver according to a third embodiment of the present invention. As shown in FIG. 6, the gate driver according to the third embodiment of the present invention is similar to the gate driver of FIG. 2 according to the first embodiment of the present invention. However, the gate driver according to the third embodiment of the present invention includes two auxiliary stages 470a and 470b and two clock repairing lines 466a and 466b, as shown in FIG. 6. The first and second auxiliary stages 470a and 470b are each identical in structure to the auxiliary stage 270 according to the first embodiment of the present invention.

As may be appreciated from FIG. 6, a first input terminal of the first auxiliary stage 470a is electrically connected to the first clock repairing line 466a, a second input terminal of the first auxiliary stage 470a is electrically connected to one end of a first output repairing line 444a, a third input terminal of the first auxiliary stage 470a is electrically connected to one end of a third output repairing line 444c, and an output terminal of the first auxiliary stage 470a is electrically connected to one end of a second output repairing line 444b.

A first input terminal of the second auxiliary stage 470b is electrically connected to the second clock repairing line 466b, a second input terminal of the second auxiliary stage 470b is electrically connected to the other end of the first output repairing line 444a, a third input terminal of the second auxiliary stage 470b is electrically connected to the other end of the third output repairing line 444c, and an output terminal of the second auxiliary stage 470b is electrically connected to the other end of the second output repairing line 444b. The first and second output repairing lines 466a and 466b are formed above clock transmission lines 488a to 488d, and are arranged across the clock transmission lines 488a to 488d.

A method of repairing the gate driver according to the third embodiment of the present invention including a stage disabled due to defects or faults will be explained in detail with reference to FIG. 7.

Figure 7:
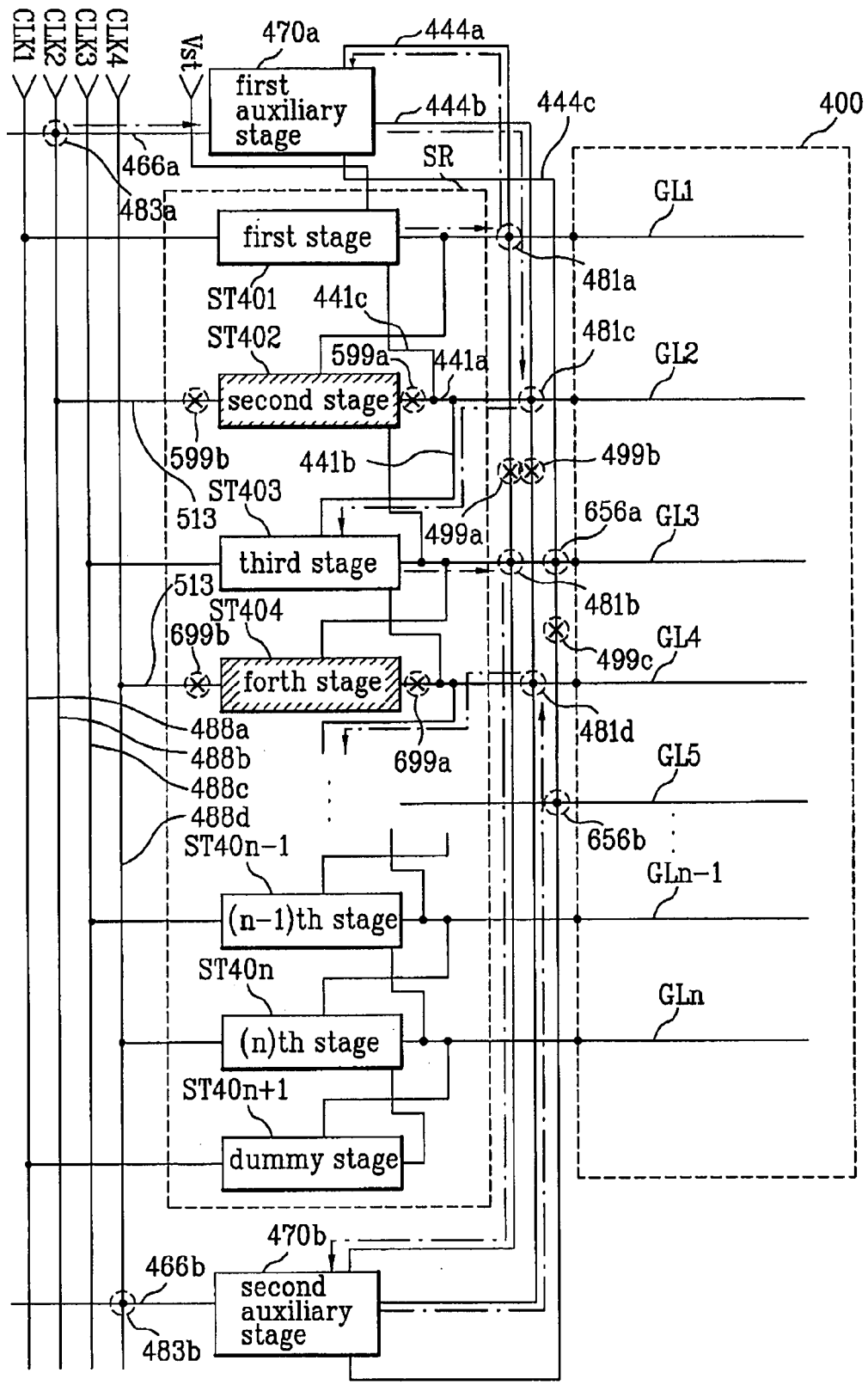
FIG. 7 is a block diagram schematically illustrating a repairing method of the gate driver of FIG. 6 when second and fourth stages of the gate driver are disabled.

FIG. 7 is a block diagram illustrating a repairing method of a gate driver of FIG. 6 having the second and fourth stages disabled by faults or defects. As shown in FIG. 7, when the second and fourth stages ST402 and ST404 are faulty, the second and fourth stages ST402 and ST404 do not generate scan pulses.

Referring to FIG. 7, the first stage ST401 operates normally so that the first gate line GL1 is normally driven by the output of the first stage ST401. However, the second and fourth stages ST402 and ST404 have faults so that third to dummy stages ST403 to ST40n+1, positioned following the second stage ST402, do not generate or output scan pulses. Accordingly, second to (n)th gate lines GL2 to GLn respectively connected to the second to (n)th stages ST402 to ST40n are not supplied with the corresponding scan pulses.

To repair the above-mentioned gate driver, the second stage ST402 is electrically isolated from the corresponding first output line 441a (that is, the first output line 441a connected to the second stage ST402). As shown in FIG. 7, a predetermined portion 599a of the first output line 441a is removed by applying laser to electrically isolate the second stage ST402 from the first output line 441a. At this time, the disconnected predetermined portion 599a of the first output line 441a is between an output terminal of the second stage ST402 and a crossing point (the crossing point between the first output line 441a of the second stage ST402 and the third output line 441c).

The second stage ST402 is electrically isolated from the second clock transmission line 488b. That is, as shown in FIG. 7, a laser is applied to a predetermined portion 599b of the transmission line 513 that electrically connects the second clock transmission line 488b with the second stage ST402, whereby the second clock transmission line 488b is electrically isolated from the second stage ST402. Electrically isolating the second stage ST402 from the second gate line GL2 prevents distorted scan pulse output from the second stage ST402 from being supplied to the second gate line GL2.

The fourth stage ST404 is electrically isolated from the first output line 441a (the first output line 441a connected to the fourth stage ST402). That is, as shown in FIG. 7, a predetermined portion 699a of the first output line 441a is removed by applying a laser to electrically isolate the fourth stage ST404 from the first output line 441a. The disconnected portion 699a of the first output line 441a may be formed between an output terminal of the fourth stage ST404 and a crossing point (the crossing point between the first output line 441a of the fourth stage ST404 and the third output line 441c).

The fourth stage ST404 is also electrically isolated from the fourth clock transmission line 488d. As shown in FIG. 7, a predetermined portion 699b of the transmission line 513 connecting the fourth clock transmission line 488d to the fourth stage ST404 may be removed by applying a laser to electrically isolate the fourth stage ST404 from the fourth clock transmission line 488d. Electrically isolating the fourth stage ST404 from the fourth gate line GL4 prevents a distorted scan pulse output from the fourth stage ST404 from being supplied to the fourth gate line GL4.

The second output repairing line 444b is electrically connected to two of the first output lines 441a. One of the two first output lines 441a is the output line connected to the first stage having the fault (that is the faulty second stage ST402). The other of the two first output lines 441a is the output line connected to the second stage having a fault (that is the faulty fourth stage ST404). These electric connections may be made by welding a crossing point 481c between the second output repairing line 444b and one of the two first output lines 441a and welding a crossing point 481d between the second output repairing line 444b and the other of the two first output lines 441a.

The first output repairing line 444a is electrically connected to the other two of first output lines 441a. At this time, one of the first output lines 441a is connected to the first stage ST401 that is positioned prior to the second stage ST402 disabled by a fault or defect. Also, the other of the first output lines 441a is connected to the third stage ST403 that is positioned prior to the fourth stage ST404 disabled by a fault or defect. This electric connection may be made by welding a crossing point 481a between the first output repairing line 444a and one of the first output lines 441a and welding a crossing point 481b between the first output repairing line 444a and the other of the first output lines 441a.

The third output repairing line 444c is electrically connected to another two of the first output lines 441a. One of the first output lines 441a is connected to the first stage positioned sequentially following the first faulty stage. In the example case illustrated in FIG. 7, the first output line 441a of the third stage ST403 that is positioned following the faulty second stage ST402 is electrically connected to the third output repairing line 444c. Another of the first output lines 441a corresponding to the stage following the second faulty stage is electrically connected to the third output repairing line 444c. In the illustrated case, the first output line 441a of the fifth stage ST405 that is positioned sequentially following the faulty fourth stage ST404 is electrically connected to the third output repairing line 444c. This electric connection may be made by welding a crossing point 656a between the third output repairing line 444c and one of the first output lines 441a and welding a crossing point 656b between the second output repairing line 444b and the other of the first output lines 441a.

The first clock repairing line 466a is electrically connected to one clock transmission line. The clock transmission line to be used transmits the clock pulse that is identical or substantially identical in timing to the clock pulse supplied to the faulty second stage ST402 (that is, a first one of the stages disabled by a fault or defect). In the illustrated case, the clock transmission line corresponding to the second clock transmission line 488b that transmits the second clock pulse CLK2 is electrically connected to the first clock repairing line 466a connected to the first auxiliary stage 470a. This electric connection may be made by welding a crossing point 483a between the first clock repairing line 466a and the second clock transmission line 488b.

The second clock repairing line 466b is electrically connected to another of the clock transmission lines. The clock transmission line to be used transmits the clock pulse that is identical or substantially identical in timing to the clock pulse supplied to the fourth stage ST404 (that is a second one of the stages disabled by a fault or defect) In the illustrated case, the clock transmission line corresponding to the fourth clock transmission line 488d that transmits the fourth clock pulse CLK4 is electrically connected to the first clock repairing line 466b connected to the second auxiliary stage 470b. This electric connection may be made by welding a crossing point 483b between the second clock repairing line 466b and the fourth clock transmission line 488d.

A predetermined portion 499a of the first output repairing line 444a is disconnected. The disconnected predetermined portion 499a of the first output repairing line 444a is positioned between the crossing points 481a and 481b. In the illustrated case, one crossing point 481a is formed at the crossing of the first output repairing line 444a and the first output line 441a (the first output line 441a connected to the first stage ST401), and another crossing point 481b is formed at the crossing of the first output repairing line 444a and the first output line 441a (the first output line 441a connected to the third stage ST403).

In addition, a predetermined portion 499b of the second output repairing line 444b is disconnected. The disconnected predetermined portion 499b of the second output repairing line 444b is positioned between the crossing points 481c and 481d. In the illustrated case, one crossing point 481c is formed at the crossing of the second output repairing line 444b and the first output line 441a (the first output line 441a connected to the second stage ST402), and another crossing point 481d is formed at the crossing of the second output repairing line 444b and the first output line 441a (the first output line 441a connected to the fourth stage ST404).

A predetermined portion 499c of the third output repairing line 444c is disconnected. The disconnected predetermined portion 499c of the third output repairing line 444c is positioned between the crossing points 656a and 656b. In the example case, one crossing point 656a is at the crossing of the third output repairing line 444c and the first output line 441a (the first output line 441a connected to the third stage ST403), and another crossing point 656b is formed at the crossing of the third output repairing line 444c and the first output line 441a (the first output line 441a connected to the fifth stage ST405).

The first, second and third output repairing lines 444a, 444b and 444c are partially disconnected as described above to prevent the mixing of signals on the respective inputs and outputs of the first and second auxiliary stages 470a and 470b.

After making the above described repairs, the first input terminal of the first auxiliary stage 470a is connected to the second clock transmission line 488b by the first clock repairing line 466a, and the second input terminal of the first auxiliary stage 470a is connected to the first output line 441a (the first output line 441a connected to the first stage ST401) by the first output repairing line 444a. In addition, the third input terminal of the first auxiliary stage 470a is connected to the first output line 441a (the first output line 441a connected to the third stage ST403) by the third output repairing line 444c, and the output terminal of the first auxiliary stage 470a is connected to the first output line 441a (the first output line 441a connected to the second stage ST402) by the second output repairing line 444b.

Further, the first input terminal of the second auxiliary stage 470b is connected to the second clock transmission line 488b by the second clock repairing line 466b, and the second input terminal of the second auxiliary stage 470b is connected to the first output line 441a (the first output line 441a connected to the third stage ST403) by the first output repairing line 444a. In addition, the third input terminal of the second auxiliary stage 470b is connected to the first output line 441a (the first output line 441a connected to the fifth stage ST405) by the third output repairing line 444c, and the output terminal of the second auxiliary stage 470b is connected to the first output line 441a (the first output line 441a connected to the fourth stage ST404) by the second output repairing line 444b.

When operating the repaired gate driver according to the third embodiment of the present invention, the first stage ST401 is enabled in response to the start pulse Vst. In this enabled state, the first stage ST401 outputs the first clock pulse CLK1 that is supplied from the first clock transmission line 488a, as the first scan pulse. The first scan pulse is supplied to the first gate line GL 1 through the first output line 441a of the first stage ST201, and is also supplied to the second stage ST402 through the first and second output lines 441a and 441b of the first stage ST401.

In the illustrated case, the second stage ST402 has a fault or defect that prevents enabling the stage. Accordingly, even though the first scan pulse output from the first stage ST401 is supplied to the second stage ST402, the second stage ST402 does not output the second scan pulse. The first scan pulse supplied to the first output line 441a of the first stage ST401 is supplied to the first auxiliary stage 470a through the crossing point 481a and the first output repairing line 444a. As a result, the first auxiliary stage 470a is enabled in response to the first scan pulse. In this enabled state, the first auxiliary stage 470a outputs the second clock pulse, supplied through the second clock transmission line 488b as a first repairing scan pulse. This first repairing scan pulse is identical or substantially identical in timing to the second scan pulse.

The repairing scan pulse output from the first auxiliary stage 470a is supplied to the second output repairing line 444b through the output terminal. Additionally, the repairing scan pulse provided to the second output repairing line 444b is supplied to the third stage ST403 through the crossing point 481c, the first output line 441a (the first output line 441a connected to the second stage ST402), and the second output line 441a (the second output line 441a connected to the second stage ST402). Accordingly, the third stage ST403 is enabled.

In this enabled state, the third stage ST403 receives the third clock pulse CLK3 from the third clock transmission line 488c, and outputs the received clock pulse as the third scan pulse. Accordingly, the third scan pulse is supplied to the third gate line GL3 through the first output line 441a of the third stage ST403, to the fourth stage ST404 through the first and second output lines 441a and 441b of the third stage ST403, and to the second stage ST402 through the first and third output lines 441a and 441c of the third stage ST403.

In the illustrated case, the fourth stage ST404 is also disabled due to a fault or defect. Accordingly, even though the third scan pulse output from the first stage ST401 is supplied to the fourth stage ST404, the fourth stage ST404 does not output the fourth scan pulse. The third scan pulse supplied to the first output line 441a of the third stage ST403 is supplied to the second auxiliary stage 470b through the crossing point 481b and the first output repairing line 444a. As a result, the second auxiliary stage 470b is enabled in response to the third scan pulse. In this enabled state, the second auxiliary stage 470b outputs the fourth clock pulse CLK4, supplied through the fourth clock transmission line 488d, as the repairing scan pulse. This repairing scan pulse is identical or substantially identical in timing to the fourth scan pulse.

The repairing scan pulse output from the second auxiliary stage 470b is supplied to the second output repairing line 444b through the output terminal. The repairing scan pulse supplied to the second output repairing line 444b is also supplied to the fifth stage ST405 through the crossing point 481d, the first output line 441a (the first output line 481a connected to the fourth stage ST404), and the second output line 441b (the second output line 441b connected to the fourth stage ST404). Accordingly, the fifth stage ST405 is enabled. As a result, the fifth to dummy stages ST405 to ST40n+1 output the scan pulses in sequence.

Additionally, the scan pulse output from the third stage ST403 is supplied to the first auxiliary stage 470a through the first output line 441a (the first output line 441a connected to the third stage ST403), the crossing point 656a, and the third output repairing line 444c. Accordingly, the first auxiliary stage 470a is disabled in response to the scan pulse output from the third stage ST403. As a result, the first auxiliary stage 470a outputs one scan pulse for each frame.

Further, the scan pulse output from the fifth stage ST405 is supplied to the second auxiliary stage 470b through the first output line 441a (the first output line 441a connected to the fifth stage ST405) and the third output repairing line 444c. Accordingly, the second auxiliary stage 470b is disabled in response to the output pulse from the fifth stage ST405. As a result, the second auxiliary stage 470*b* outputs one scan pulse for each frame.

Hereinafter, a gate driver according to a fourth embodiment of the present invention will be explained with reference to FIG. 8.

Figure 8:
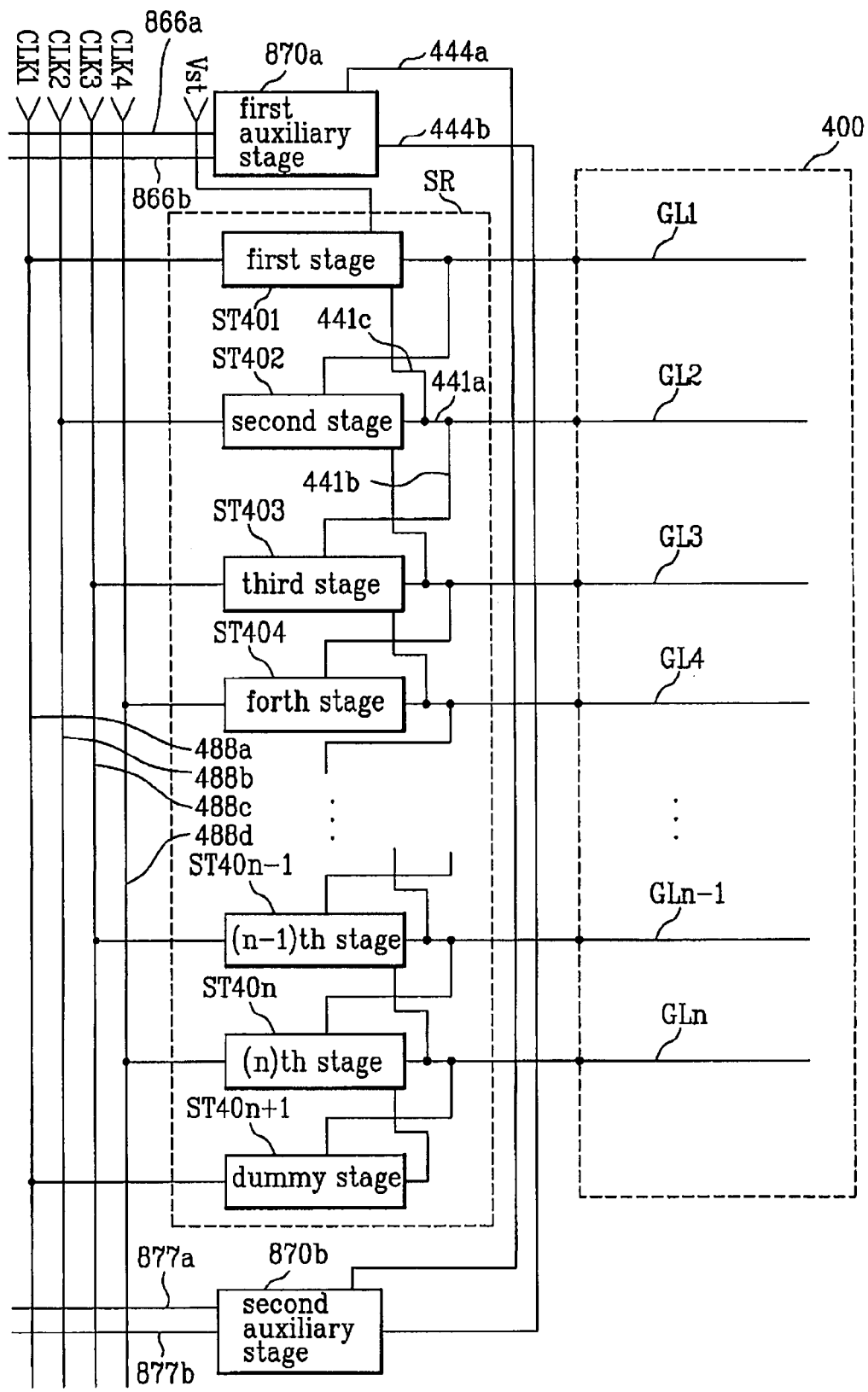
FIG. 8 is a block diagram schematically illustrating a gate driver according to a fourth embodiment of the present invention.

FIG. 8 is a block diagram illustrating a gate driver according to the fourth embodiment of the present invention. The gate driver according to the fourth embodiment of the present invention is similar in structure to the gate driver according to the third embodiment of the present invention. As shown in FIG. 8, the gate driver according to the fourth embodiment of the present invention includes first and second auxiliary stages 870*a* and 870*b*, wherein each of the first and second auxiliary stages 870*a* and 870*b* is provided with two clock repairing lines 866*a*, 866*b*, 877*a* and 877*b*. Additionally, the gate driver according to the fourth embodiment may omit the third output repairing line 444*c* used in the gate driver according to the third embodiment.

In the gate driver according to the fourth embodiment of the present invention, the first auxiliary stage 870*a* is electrically connected to the first clock repairing line 866*a* through a first input terminal, and is also connected to the second clock repairing line 866*b* through a third input terminal. In addition, the second auxiliary stage 870*b* is electrically connected to the third clock repairing line 877*a* through a first input terminal, and is also connected to the fourth clock repairing line 877*b* through a third input terminal.

Additionally, a second input terminal of the first auxiliary stage 870*a* is connected to one end of a first output repairing line 444*a*, and an output terminal of the first auxiliary stage 870*a* is connected to one end of a second output repairing line 444*b*.

The second input terminal of the second auxiliary stage 870*b* is connected to the other end of the first output repairing line 444*a*, and the output terminal of the second auxiliary stage 870*b* is connected to the other end of the second output repairing line 444*b*.

A method of repairing the gate driver according to the fourth embodiment of the present invention and including a stage disabled by a fault or defect will be explained in detail with reference to FIG. 9.

Figure 9:
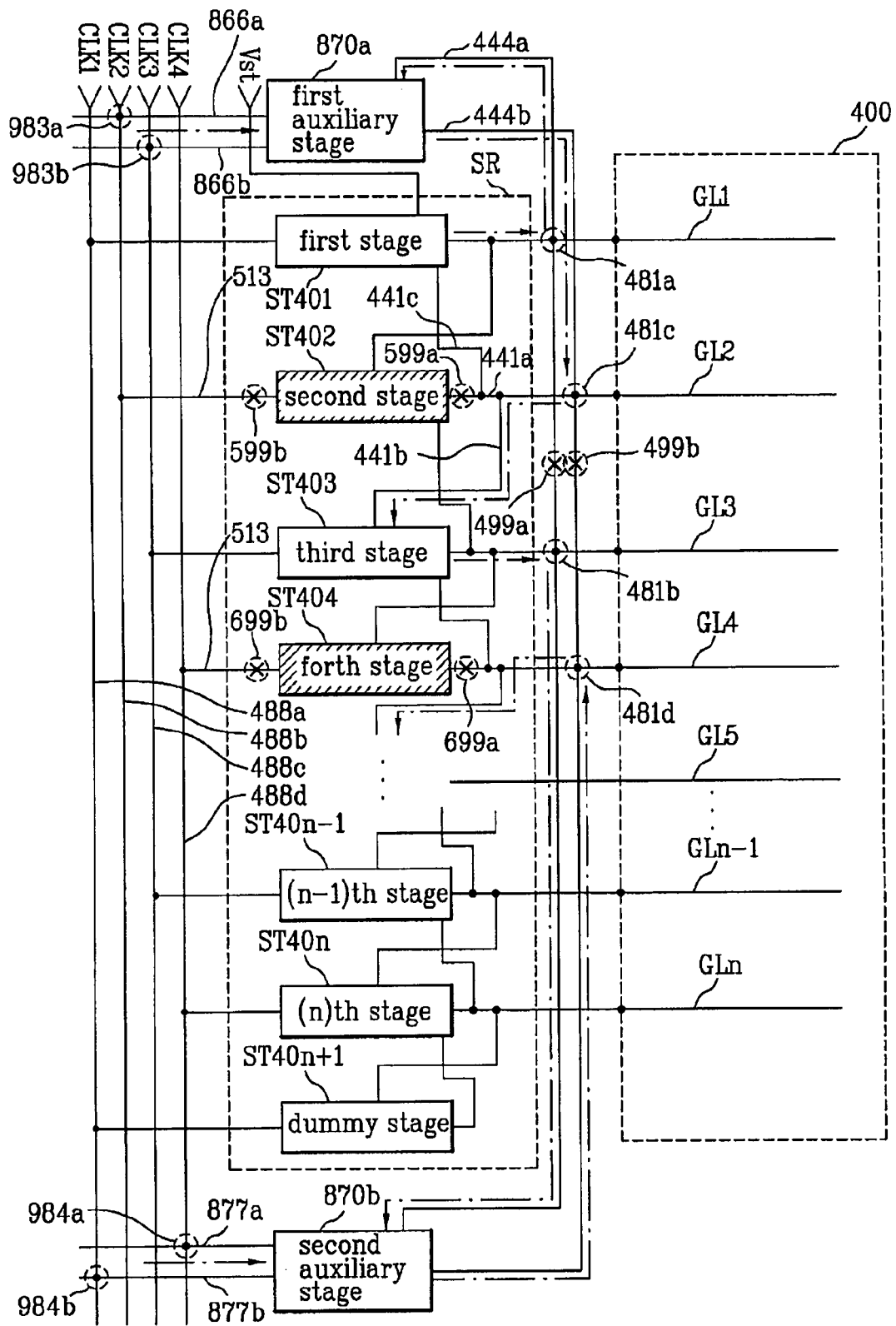
FIG. 9 is a block diagram schematically illustrating a repairing method of the gate driver of FIG. 8 when second and fourth stages of the gate driver are disabled.

FIG. 9 is a block diagram illustrating a repairing method of a gate driver when second and fourth stages of FIG. 8 do not operate because of faults or defects. As shown in FIG. 9, when the second and fourth stages ST402 and ST404 are faulty, the second and fourth stages ST402 and ST404 generate no output. As may be appreciated from FIG. 9, the first stage ST401 is normally driven so that the first gate line GL1 is normally driven. However, because the second and fourth stages ST402 and ST404 are faulty that third to dummy stages ST403 to ST40*n*+1, positioned following the second stage ST402, do not output scan pulses. Accordingly, the second to (n)th gate lines GL2 to GL*n* respectively connected to second to (n)th stages ST402 to ST40*n* are not supplied with scan pulses.

To repair the above-mentioned gate driver, the second stage ST402 is electrically isolated from a first output line 441*a* (the first output line 441*a* connected to the second stage ST402). That is, as shown in FIG. 9, according as a predetermined portion 599*a* of the first output line 441*a* is removed by applying laser thereto, the second stage ST402 is electrically isolated from the first output line 441*a*. The disconnected portion 599*a* of the first output line 441*a* may be formed between an output terminal of the second stage ST402 and a crossing point (the crossing point between the first output line 441*a* of the second stage ST402 and the third output line 441*c*).

The second stage ST402 is electrically isolated from the second clock transmission line 488*b*. That is, as shown in FIG. 9, a laser may be applied to a predetermined portion 599*b* of the transmission line 513 that electrically connects the second clock transmission line 488*b* to the second stage ST402 to remove the predetermined portion 599*b* of the transmission line 513 thereby electrically separating or isolating the second clock transmission line 488*b* from the second stage ST402. Electrically isolating the second stage ST402 from the second gate line GL4 prevents a distorted scan pulse output from the second stage ST402 from being supplied to the second gate line GL2.

Similarly, the fourth stage ST404 is electrically isolated with the first output line 441*a* (the first output line 441*a* connected to the fourth stage ST404). That is, as shown in FIG. 9, as a predetermined portion 699*a* of the first output line 441*a* is removed by applying laser thereto, the fourth stage ST404 is electrically isolated from the first output line 441*a*. The disconnected portion 699*a* of the first output line 441*a* may be formed between an output terminal of the fourth stage ST404 and a crossing point (the crossing point between the first output line 441*a* of the fourth stage ST404 and the third output line 441*c*).

The fourth stage ST404 is electrically isolated from the fourth clock transmission line 488*d*. As shown in FIG. 9, a laser may be applied to a predetermined portion 699*b* of the transmission line 513 that electrically connects the fourth clock transmission line 488*d* to the fourth stage ST404 to remove the predetermined portion 699*b*. Electrically isolating the fourth stage ST404 from the fourth gate line GL4 prevents a distorted scan pulse output from the fourth stage ST404 from being supplied to the fourth gate line GL4.

The second output repairing line 444*b* is electrically connected to two of first output lines 441*a*. The selected one of the first output lines 441*a* is the first output line 441*a* connected to a faulty stage. In the illustrated case, the output line 441*a* connected to the second stage ST402 is electrically connected to the second output repairing line 444*b*. Another of the first output lines 441*a* is connected to a second stage having a fault may also be connected to the second output repairing line 444*b*. In the illustrated case, the faulty fourth stage ST404 is electrically connected to the second output repairing line 444*b*. These electric connections may be made by welding a crossing point 481*c* between the second output repairing line 444*b* and one of the first output lines 441*a*, and welding a crossing point 481*d* between the second output repairing line 444*b* and the other of the first output lines 441*a*.

The first output repairing line 444*a* is electrically connected to two other of the first output lines 441*a*. One of the two output lines is the output line of the stage positioned prior to a first stage having a fault. In the illustrated case having a faulty second stage ST402, the first output lines 441*a* connected to the first stage ST401 is electrically connected to the first output repairing line 444*a*. The other of the first output lines 441*a* connected to the third stage ST403 (the stage positioned prior to the second faulty stage) is electrically connected to the first output repairing line 444*a*. These electric connections may be made by welding a crossing point 481*a* between the first output repairing line 444*a* and one of the first output lines 441*a* and welding a crossing point 481*b* between the first output repairing line 444*a* and the other of the first output lines 441*a*.

The first clock repairing line 866*a* is electrically connected to one clock transmission line. The clock transmission to be selected line is the clock transmission line that transmits the clock pulse which is identical or substantially identical in timing to the clock pulse supplied to the second stage ST402

(the first of the stages having a fault). In the illustrated case, the clock transmission line corresponding to the second clock transmission line 488*b* which transmits the second clock pulse CLK2 is electrically connected to the first clock repairing line 866*a*. This electric connection may be made by welding a crossing point 983*a* between the first clock repairing line 866*a* and the second clock transmission line 488*b*.

The second clock repairing line 866*b* is electrically connected to another clock transmission line. The clock transmission line transmits the clock pulse which is identical or substantially identical in timing to the clock pulse supplied to the third stage ST403 positioned following the second stage ST402 of the disabled state. That is, the clock transmission line corresponding to the third clock transmission line 488*c* which transmits the third clock pulse CLK3 is electrically connected to the second clock repairing line 866*b*. This electric connection may be made by welding a crossing point 983*b* between the second clock repairing line 866*b* and the third clock transmission line 488*c*.

The third clock repairing line 877*a* is electrically connected to another clock transmission line. The clock transmission line to be used transmits the clock pulse which is identical or substantially identical in timing to the clock pulse supplied to the second faulty stage. In the case illustrated in FIG. 9, the clock transmission line corresponding to the fourth clock transmission line 488*d* that transmits the fourth clock pulse CLK4 is electrically connected to the third clock repairing line 877*a*. This electric connection may be made by welding a crossing point 984*a* between the third clock repairing line 877*a* and the fourth clock transmission line 488*d*.

The fourth clock repairing line 877*b* is electrically connected to another clock transmission line. The clock transmission line to be connected transmits the clock pulse that is identical or substantially identical in timing to the clock pulse supplied to the stage following the second faulty stage. In the case illustrated in FIG. 9, as the fifth stage ST405 is positioned following the faulty fourth stage ST404, the first clock transmission line 488*a* that transmits the first clock pulse CLK1 is electrically connected to the fourth clock repairing line 877*b*. This electric connection may be made by welding a crossing point 984*b* between the fourth clock repairing line 877*b* and the first clock transmission line 488*a*.

A predetermined portion 499*a* of the first output repairing line 444*a* is disconnected, wherein the disconnected predetermined portion 499*a* of the first output repairing line 444*a* is positioned between the crossing points 481*a* and 481*b*. In the example case illustrated in FIG. 9, one crossing point 481*a* is formed by crossing the first output repairing line 444*a* and the first output line 441*a* (the first output line 441*a* connected to the first stage ST401). Another crossing point 481*b* is formed by crossing the first output repairing line 444*a* and the first output line 441*a* (the first output line 441*a* connected to the third stage ST403).

Additionally, a predetermined portion 499*b* of the second output repairing line 444*b* is disconnected, wherein the disconnected predetermined portion 499*b* of the second output repairing line 444*b* is positioned between the crossing points 481*c* and 481*d*. In the illustrated case, one crossing point 481*c* is formed by crossing the second output repairing line 444*b* and the first output line 441*a* (the first output line 441*a* connected to the second stage ST402), and the other crossing point 481*d* is formed by crossing the second output repairing line 444*b* and the first output line 441*a* (the first output line 441*a* connected to the fourth stage ST404).

The predetermined portions of the respective first and second output repairing lines 444*a* and 444*b* are disconnected prevent the respective outputs of the first and second auxiliary stages 870*a* and 870*b* from being mixed.

Accordingly, the first input terminal of the first auxiliary stage 870*a* is connected to the second clock transmission line 488*b* by the first clock repairing line 866*a*, and the third input terminal of the first auxiliary stage 870*a* is connected to the third clock transmission line 488*c* by the second clock repairing line 866*b*. The second input terminal of the first auxiliary stage 870*a* is connected to the first output line 441*a* (the first output line 441*a* connected to the first stage ST401) by the first output repairing line 444*a*, and the output terminal of the first auxiliary stage 870*a* is connected to the first output line 441*a* (the first output line 441*a* connected to the second stage ST402) by the second output repairing line 444*b*.

In addition, the first input terminal of the second auxiliary stage 870*b* is connected to the fourth clock transmission line 488*d* by the third clock repairing line 877*a*, and the third input terminal of the second auxiliary stage 870*b* is connected to the first clock transmission line 488*a* by the fourth clock repairing line 877*b*. Also, the second input terminal of the second auxiliary stage 870*b* is connected to the first output line 441*a* (the first output line 441*a* connected to the third stage ST403) by the first output repairing line 444*a*, and the output terminal of the second auxiliary stage 870*b* is connected to the first output line 441*a* (the first output line 44*a* connected to the fourth stage ST404) by the second output repairing line 444*b*.

When operating the repaired gate driver according to the fourth embodiment of the present invention, the first stage ST401 is enabled in response to the start pulse Vst. In this enabled state, the first stage ST401 outputs the first clock pulse CLK1, which is supplied from the first clock transmission line 488*a*, as the first scan pulse. The first scan pulse is supplied to the first gate line GL1 through the first output line 441*a* of the first stage ST401 and is also supplied to the second stage ST402 through the first and second output lines 441*a* and 441*b* of the first stage ST401. In this case, the second stage ST402 has a fault and is not enabled. Thus, even though the first scan pulse output from the first stage ST401 is supplied to the second stage ST402, the second stage ST402 does not output the second scan pulse.

The first scan pulse supplied to the first output line 441*a* of the first stage ST401 is supplied to the first auxiliary stage 870*a* through the crossing point 481*a* and the first output repairing line 444*a*. As a result, the first auxiliary stage 870*a* is enabled in response to the first scan pulse. In this enabled state, the first auxiliary stage 870*a* receives the second clock pulse CLK2 from the second clock transmission line 488*b*, and outputs the received one as the repairing scan pulse. This repairing scan pulse is identical or substantially identical in timing to the second scan pulse.

The repairing scan pulse output from the first auxiliary stage 870*a* is supplied to the second output repairing line 444*b* through the output terminal. Additionally, the repairing scan pulse supplied to the second output repairing line 444*b* is supplied to the third stage ST403 through the crossing point 481*c*, the first output line 441*a* (the first output line 441*a* connected to the second stage ST402), and the second output line 441*b* (the second output line 441*b* connected to the second stage ST402). Accordingly, the third stage ST403 is enabled.

As the third clock pulse CLK3 is applied to the enabled third stage ST403 by the third clock transmission line 488*c*, the third stage ST403 outputs the third clock pulse CLK3 as the third scan pulse. The third scan pulse is supplied to the third gate line GL3 through the first output line 441*a* of the third stage ST403, to the fourth stage ST404 through the first and second output lines 441*a* and 441*b* of the third stage ST403 and is also supplied to the second stage ST402 through the first and third output lines 441*a* and 441*c* of the third stage ST403. In this case, the fourth stage ST404 has a fault preventing the fourth stage from being enabled. Thus, even though the third scan pulse is supplied to the fourth stage ST404 from the first stage ST401, the fourth stage ST404 does not output the fourth scan pulse.

The third scan pulse supplied to the first output line 441*a* of the third stage ST403 is supplied to the second auxiliary stage 870*b* through the crossing point 481*b* and the first output repairing line 444*a*. Accordingly, the second auxiliary stage 870*b* is enabled in response to the third scan pulse. In this enabled state, the second auxiliary stage 870*b* receives the fourth clock pulse CLK4 from the fourth clock transmission line 488*d* and outputs the received one as the repairing scan pulse. This repairing scan pulse is identical or substantially identical in timing to the fourth scan pulse.

The repairing scan pulse output from the second auxiliary stage 870*b* is also supplied to the second output repairing line 444*b* through the output terminal, and the repairing scan pulse supplied to the second output repairing line 444*b* is supplied to the fifth stage ST405 through the crossing point 481*d*, the first output line 441*a* (the first output line 441*a* connected to the fourth stage ST404), and the second output line 441*b* (the second output line 441*b* connected to the fourth stage ST404). Accordingly, the fifth stage ST405 is enabled. As a result, the fifth to dummy stages ST405 to ST40n+1 output the scan pulses in sequence.

The third clock pulse CLK3 supplied from the third clock transmission line 488*c* is supplied to the first auxiliary stage 870*a* through the crossing point 983*b* and the second clock repairing line 866*a*. Accordingly, the first auxiliary stage 870*a* is disabled in response to the third clock pulse CLK3. Thus, the first auxiliary stage 870*a* outputs one scan pulse for each frame.

Additionally, the first clock pulse CLK1 supplied from the first clock transmission line 488*a* is supplied to the second auxiliary stage 870*b* through the crossing point 984*b* and the fourth clock repairing line 877*b*. Accordingly, the second auxiliary stage 870*b* is disabled in response to the first clock pulse CLK1. As a result, the second auxiliary stage 870*b* outputs one scan pulse for each frame.

Hereinafter, a gate driver according to a fifth embodiment of the present invention will be explained as follows.

Figure 10:
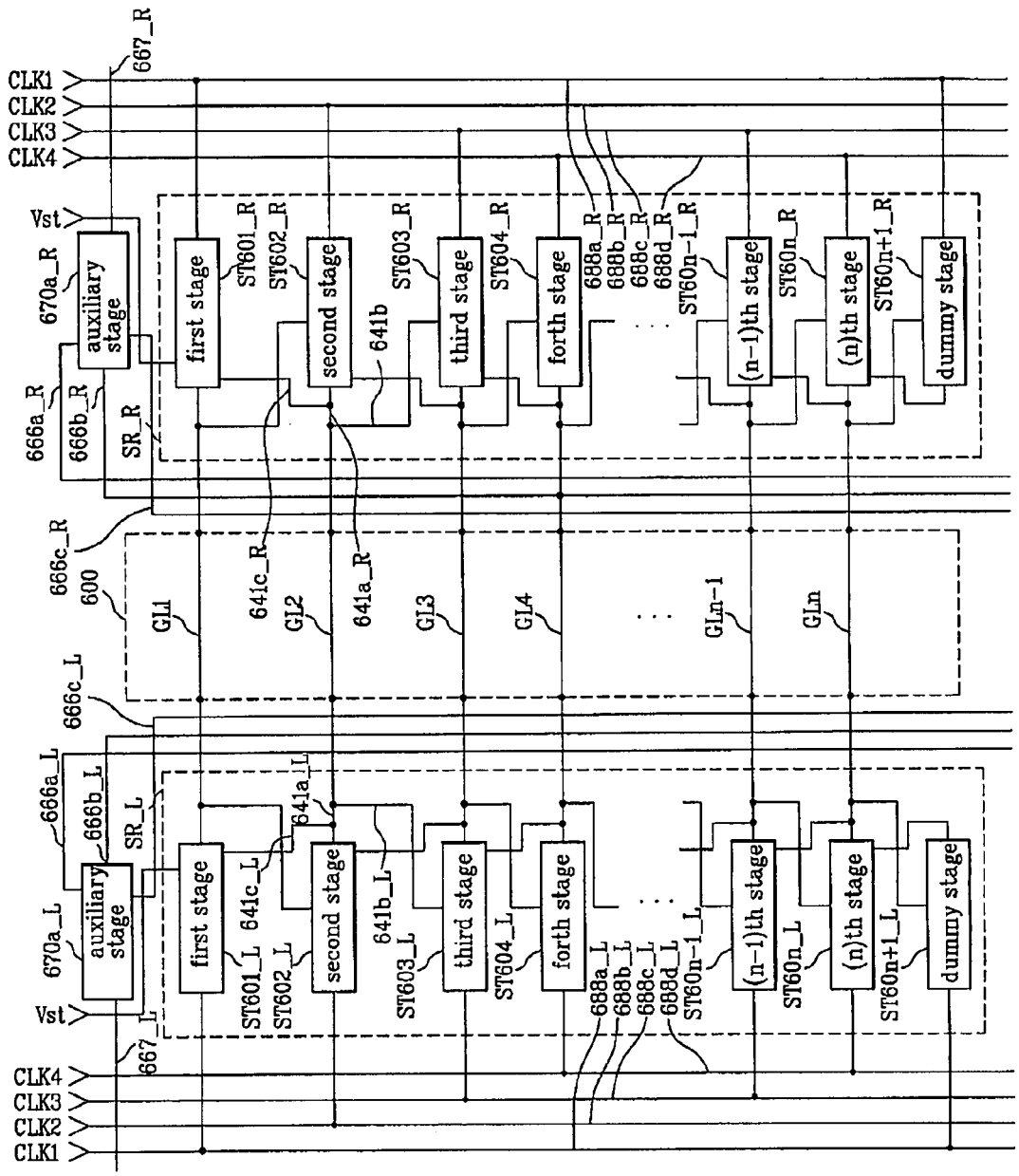
FIG. 10 is a block diagram schematically illustrating a gate driver according to the fifth embodiment of the present invention.

FIG. 10 is a block diagram illustrating a gate driver according to the fifth embodiment of the present invention. As shown in FIG. 10, the gate driver according to the fifth embodiment of the present invention includes two gate drivers similar to those illustrated in FIG. 2 positioned on opposite sides of a display area. In this case, one of the gate drivers is connected to one end of gate lines, and the other is connected to the other end of gate lines.

A first shift register SR_L is connected to one end of gate lines GL1 to GLn formed in a display area 600 by corresponding first output lines 641*a*_L. First to third output repairing lines 666*a*_L, 666*b*_L and 666*c*_L are formed above the first output lines 641*a*_L, and are provided to cross the first output lines 641*a*_L.

The first shift register SR_L is supplied with first to fourth clock pulses CLK1 to CLK4 transmitted through first to fourth clock transmission lines 688*a*_L to 688*d*_L. A clock repairing line 667_L is formed above the clock transmission lines 688*a*_L to 688*d*_L, and is provided to cross the clock transmission lines 688*a*_L to 688*d*_L.

The first shift register SR_L includes one dummy stage ST60n+1_L and a plurality of stages ST601_L to ST60n_L, wherein the plurality of stages ST601_L to ST60n_L are respectively connected to one end of the gate lines GL1 to GLn. The first output repairing line 666*a*_L, the second output repairing line 666*b*_L, the third output repairing line 666*c*_L, and the clock repairing line 667_L are connected to an auxiliary stage 670*a*_L.

A second shift register SR_R is connected to the other end of gate lines GL1 to GLn formed in the display area 600 by corresponding first output lines 641*a*_R. First to third output repairing lines 666*a*_R, 666*b*_R and 666*c*_R are formed above the first output lines 641*a*_R, and are provided across the first output lines 641*a*_R.

The second shift register SR_R is supplied with first to fourth clock pulses CLK1 to CLK4 transmitted through first to fourth clock transmission lines 688*a*_R to 688*d*_R. A clock repairing line 667_R is formed above the clock transmission lines 688*a*_R to 688*d*_R and is provided across the clock transmission lines 688*a*_R to 688*d*_R.

The second shift register SR_R includes one dummy stage ST60n+1_R and a plurality of stages ST601_R to ST60n_R, wherein the plurality of stages ST601_R to ST60n_R are respectively connected to the other end of the gate lines GL1 to GLn. The first output repairing line 666*a*_R, the second output repairing line 666*b*_R, the third output repairing line 666*c*_R, and the clock repairing line 667_R are connected to an auxiliary stage 670*a*_R.

The repairing method of the gate driver according to the fifth embodiment of the present invention is identical to that described for the first and second embodiments of the present invention.

Gate driver having other structures may be used in place of the gate drivers shown in FIG. 10. For example gate drivers having the structures shown in FIG. 4, 6 or 8 may be employed.

Alternatively, gate drivers omitting the third output repairing lines 222*c*, 444*c*, 666*c*_L and 666*c*_R described in to the first, third and fifth embodiments may be used. When the third output repairing lines 222*c*, 444*c*, 666*c*_L and 666*c*_R are omitted from the first, third, and fifth embodiments, a full-down switching device provided in the auxiliary stage is larger in size than a full-up switching device provided in the auxiliary stage.

That is, each auxiliary stage includes: a node controller which controls the charged/discharged state of first and second nodes; a full-up switching device which outputs a scan pulse on the basis of the state of first node; and a full-down switching device that outputs a low-potential voltage on the basis of the state of the second node.

In order to decrease the size of display device, the shift register SR may be formed in the periphery of an LCD panel 200 or 400, that is, in a non-display area of the LCD panel 200 or 400.

The auxiliary stage according to embodiments of the present invention may be positioned at one side of the outermost stage. For example, the auxiliary stage may be positioned at an upper side of the first stage or at a lower side of the dummy stage.

An auxiliary stage may alternatively be positioned between each of the adjacent stages. If providing a plurality of auxiliary stages, the auxiliary stages may be provided between groups including a plurality of stages. For example, the plurality of stages may be divided into a plurality of groups each provided with at least two stages, and the auxiliary stages may respectively provided between adjacent groups of the stages.

As mentioned above, the gate driver according to the present invention and the repairing method thereof have the following advantages.

The gate driver according to the present invention may be provided with the plurality of auxiliary stages which substitute for a stage having a fault or defect to facilitate a repair of the gate driver.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A gate driver comprising:

a shift register provided with a plurality of first output lines;

first to second output repairing lines arranged across the plurality of first output lines;

at least two clock transmission lines to transmit at least two clock pulses of different phases;

first and second clock repairing lines arranged across the at least two clock transmission lines; and a first auxiliary stage connected to the first to second output repairing lines and to the first clock repairing line;

a second auxiliary stage connected to the first to second output repairing lines and to the second clock repairing line;

wherein the shift register includes a plurality of stages in a sequence that are each supplied with at least one of the at least two clock pulses transmitted through the at least two clock transmission lines and that each outputs the supplied at least one clock pulse as a corresponding scan pulse through a corresponding one of the plurality of first output lines;

wherein the first auxiliary stage is connected to one end of the first output repairing line, one end of the second output repairing line, and the first clock repairing line; and wherein the second auxiliary stage is connected to another end of the first output repairing line, another end of the second output repairing line, and the second clock repairing line;

wherein the first and second clock repairing lines are disconnected from the at least two clock transmission lines;

wherein the first clock repairing line is connected to a clock transmission line when a first predetermined stage among the plurality of the stages is a disabled stage;

wherein the first predetermined stage is disconnected from a first clock transmission line that supplies a clock pulse to the first predetermined stage when the first predetermined stage is a disabled stage, wherein the first predetermined stage is disconnected from the first clock transmission line by removing a transmission line which electrically connects the first clock transmission line to the first predetermined stage;

wherein the second clock repairing line is connected to a clock transmission line when a second predetermined stage among the plurality of the stages is a disabled stage;

wherein the second predetermined stage is disconnected from a second clock transmission line that supplies a clock pulse to the second predetermined stage when the second predetermined stage is a disabled stage, wherein the second predetermined stage is disconnected from the second clock transmission line by removing a transmission line which electrically connects the second clock transmission line to the second predetermined stage;

wherein the first auxiliary stage is positioned right above a first stage of the stages;

wherein the second auxiliary stage is positioned right under a last stage of the stages;

wherein the last stage is a dummy stage which is not connected to gate line;

wherein a full-down switching device provided in each of the first and second auxiliary stages is larger in size than a full-up switching device provided in each of the first and second auxiliary stages.

2. The gate driver of claim 1, wherein one end of each first output line is connected to each stage and another end thereof is connected to each gate line of an LCD panel.

3. The gate driver of claim 1, further comprising a second output line to supply a scan pulse output from an (n−1)th stage to an (n)th stage, wherein the second output line connects a first output line of the (n−1)th stage to the (n)th stage, and where n is a positive integer.

4. The gate driver of claim 3, further comprising a third output line that supplies a scan pulse output from an (n+1)th stage to the (n)th stage, wherein the third output line connects a first output line of the (n+1)th stage to the (n)th stage.

5. The gate driver of claim 1, wherein the first output repairing line is connected to a first output line of a stage prior in sequence to a first predetermined stage, and is connected to a first output line of a stage prior in sequence to a second predetermined stage; the second output repairing line is connected to a first output line of the first predetermined stage, and is connected to a first output line of the second predetermined stage; the first clock repairing line is connected to a clock transmission line that transmits a clock pulse to the first predetermined stage; the second clock repairing line is connected to a clock transmission line that transmits a clock pulse to the second predetermined stage; wherein predetermined portions of the respective first and second output repairing lines are disconnected;

and wherein the first and second predetermined stages are disabled stages.

6. The gate driver of claim 5, wherein the first output repairing line is connected to a first output line of an (n−1)th stage and a first output line of an m−1)th stage; the second output repairing line is connected to a first output line of an (n)th stage and a first output line of an (m)th stage; the first clock repairing line is connected to a clock transmission line that transmits a clock pulse to the (n)th stage; the second clock repairing line is connected to a clock transmission line that transmits a clock pulse to the (m)th stage; the first output repairing line is electrically disconnected between the first output line of the (n−1)th stage and the first output line of the (m−1)th stage; the second output repairing line is electrically disconnected between the first output line of the (n)th stage and the first output line of the (m)th stage, wherein n is an integer greater than 2 and m is an integer greater than n.

7. A repairing method of a gate driver provided with a shift register including: a plurality of stages in a sequence provided with a plurality of output lines; first and second output repairing lines arranged across the plurality of output lines; at least two clock transmission lines to transmit at least two clock pulses provided with a phase difference therebetween; first and second clock repairing lines arranged across the at least two clock transmission lines, wherein the first and second clock repairing lines are disconnected from the at least two clock transmission lines; a first auxiliary stage connected to one end of the first output repairing line, one end of the second output repairing line, and the first clock repairing line; and a second auxiliary stage connected to another end of the first output repairing line, another end of the second output repairing line, and the second clock repairing line, comprising:

connecting the first output repairing line to the output line of a stage prior in the sequence to a first predetermined stage among the plurality of stages provided in the shift register, wherein the first predetermined stage is a disabled stage;

connecting the second output repairing line to the output line of the first predetermined stage;

connecting the first output repairing line to the output line of a stage prior in sequence to a second predetermined stage among the plurality of stages provided in the shift register, wherein the second predetermined stage is a disabled stage;

connecting the second output repairing line to the output line of the second predetermined stage;

connecting the first clock repairing line to a clock transmission line that transmits a clock pulse to the first predetermined stage;

connecting the second clock repairing line to a clock transmission line that transmits a clock pulse to the second predetermined stage;

disconnecting predetermined portions of the respective first and second output repairing lines;

electrically separating the first predetermined stage from a first clock transmission line that supplies a clock pulse to the first predetermined stage, wherein the first predetermined stage is disconnected from the first clock transmission line by removing a transmission line which electrically connects the first clock transmission line to the first predetermined stage; and electrically separating the second predetermined stage from a second clock transmission line that supplies a clock pulse to the second predetermined stage, wherein the second predetermined stage is disconnected from the second clock transmission line by removing a transmission line which electrically connects the second clock transmission line to the second predetermined stage;

wherein the first auxiliary stage is positioned right above a first stage of the stages;

wherein the second auxiliary stage is positioned right under a last stage of the stages;

wherein the last stage is a dummy stage which is not connected to gate line;

wherein a full-down switching device provided in each of the first and second auxiliary stages is larger in size than a full-up switching device provided in each of the first and second auxiliary stages.

* * * * *